United States Patent
Ichikawa et al.

(10) Patent No.: US 10,629,517 B2
(45) Date of Patent: Apr. 21, 2020

(54) SEMICONDUCTOR DEVICE AND FABRICATION METHOD THEREOF

(71) Applicant: FUJI ELECTRIC CO., LTD., Kanagawa (JP)

(72) Inventors: Koji Ichikawa, Matsusaka (JP); Kento Shirata, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/016,682

(22) Filed: Jun. 25, 2018

(65) Prior Publication Data

US 2019/0067166 A1 Feb. 28, 2019

(30) Foreign Application Priority Data

Aug. 30, 2017 (JP) .................. 2017-166275

(51) Int. Cl.
| | |
|---|---|
| *H01L 23/492* | (2006.01) |
| *H01R 4/02* | (2006.01) |
| *H01R 43/02* | (2006.01) |
| *H01L 23/49* | (2006.01) |
| *H01L 25/07* | (2006.01) |
| *H01L 23/00* | (2006.01) |
| *H01L 23/498* | (2006.01) |
| *H01L 21/48* | (2006.01) |

(52) U.S. Cl.
CPC ........ *H01L 23/492* (2013.01); *H01L 21/4853* (2013.01); *H01L 23/49* (2013.01); *H01L 23/49811* (2013.01); *H01L 23/49827* (2013.01); *H01L 24/01* (2013.01); *H01L 25/072* (2013.01); *H01R 4/029* (2013.01); *H01R 43/0221* (2013.01); *H01L 24/29* (2013.01); *H01L 24/33* (2013.01); *H01L 2224/29101* (2013.01); *H01L 2224/32225* (2013.01); *H01L 2224/33181* (2013.01); *H01L 2924/1203* (2013.01); *H01L 2924/13055* (2013.01); *H01L 2924/13091* (2013.01); *H01L 2924/15312* (2013.01)

(58) Field of Classification Search
CPC ..... H01L 2924/15312; H01L 23/49811; H01L 23/49827; H01L 21/4853
See application file for complete search history.

(56) References Cited

U.S. PATENT DOCUMENTS

| | | | | |
|---|---|---|---|---|
| 5,272,590 A | * | 12/1993 | Hernandez | ........... H01G 4/35 361/306.2 |
| 5,914,527 A | * | 6/1999 | Freeman | ........... H01L 23/3185 257/621 |
| 6,111,199 A | * | 8/2000 | Wyland | ........... H01L 23/055 174/18 |
| 6,344,682 B1 | * | 2/2002 | Tomita | ........... H01L 23/5385 257/685 |

(Continued)

FOREIGN PATENT DOCUMENTS

JP 2014236150 A 12/2014

*Primary Examiner* — Ngan V Ngo

(57) ABSTRACT

A semiconductor device including a connection terminal that is electrically connected to a semiconductor chip, a bus bar with an opening through which the connection terminal passes, and a fusing portion including a jointing portion, which is provided over an upper surface of the bus bar from an upper part of the connection terminal that is positioned above the upper surface of the bus bar by making the connection terminal pass through the opening of the bus bar, is provided.

20 Claims, 24 Drawing Sheets

(56) References Cited

U.S. PATENT DOCUMENTS

| | | | |
|---|---|---|---|
| 6,741,778 B1* | 5/2004 | Chan | G02B 6/4231 385/52 |
| 9,299,637 B2* | 3/2016 | Yamada | H01L 24/01 |
| 10,163,868 B2* | 12/2018 | Horio | H01L 23/3735 |
| 2008/0185708 A1* | 8/2008 | Chen | H01L 23/49811 257/698 |
| 2009/0278246 A1* | 11/2009 | Hoshino | H01L 21/6835 257/686 |
| 2010/0013086 A1* | 1/2010 | Obiraki | H01L 23/3121 257/693 |
| 2011/0193105 A1* | 8/2011 | Lerman | H01L 25/0753 257/88 |
| 2012/0112332 A1* | 5/2012 | Minamio | H01L 21/565 257/675 |
| 2012/0127681 A1* | 5/2012 | Ryu | H05K 3/306 361/772 |
| 2012/0155055 A1* | 6/2012 | Kang | H01L 23/562 361/820 |
| 2012/0241953 A1* | 9/2012 | Yamada | H05K 7/02 257/737 |
| 2012/0318346 A1* | 12/2012 | Miyashita | H01G 9/2068 136/256 |
| 2014/0346630 A1* | 11/2014 | Kamarainen | H01L 31/18 257/433 |
| 2014/0355219 A1 | 12/2014 | Tada et al. | |
| 2014/0370663 A1* | 12/2014 | Bayerer | H01L 23/49861 438/125 |
| 2015/0223339 A1* | 8/2015 | Nakamura | H01L 23/3735 361/705 |
| 2015/0303164 A1* | 10/2015 | Chen | H01L 24/32 361/720 |
| 2016/0240452 A1* | 8/2016 | Prajuckamol | H01L 23/49811 |
| 2016/0247735 A1* | 8/2016 | Lin | H01L 23/053 |
| 2017/0113387 A1* | 4/2017 | Huber | B29C 33/303 |
| 2018/0012833 A1* | 1/2018 | Kato | H01L 23/057 |
| 2018/0126175 A1* | 5/2018 | Seitz | A61N 1/3754 |
| 2019/0064219 A1* | 2/2019 | Rhee | G01R 31/2886 |
| 2019/0090393 A1* | 3/2019 | Tanaka | H05K 13/0465 |

* cited by examiner

AFTER WELDING

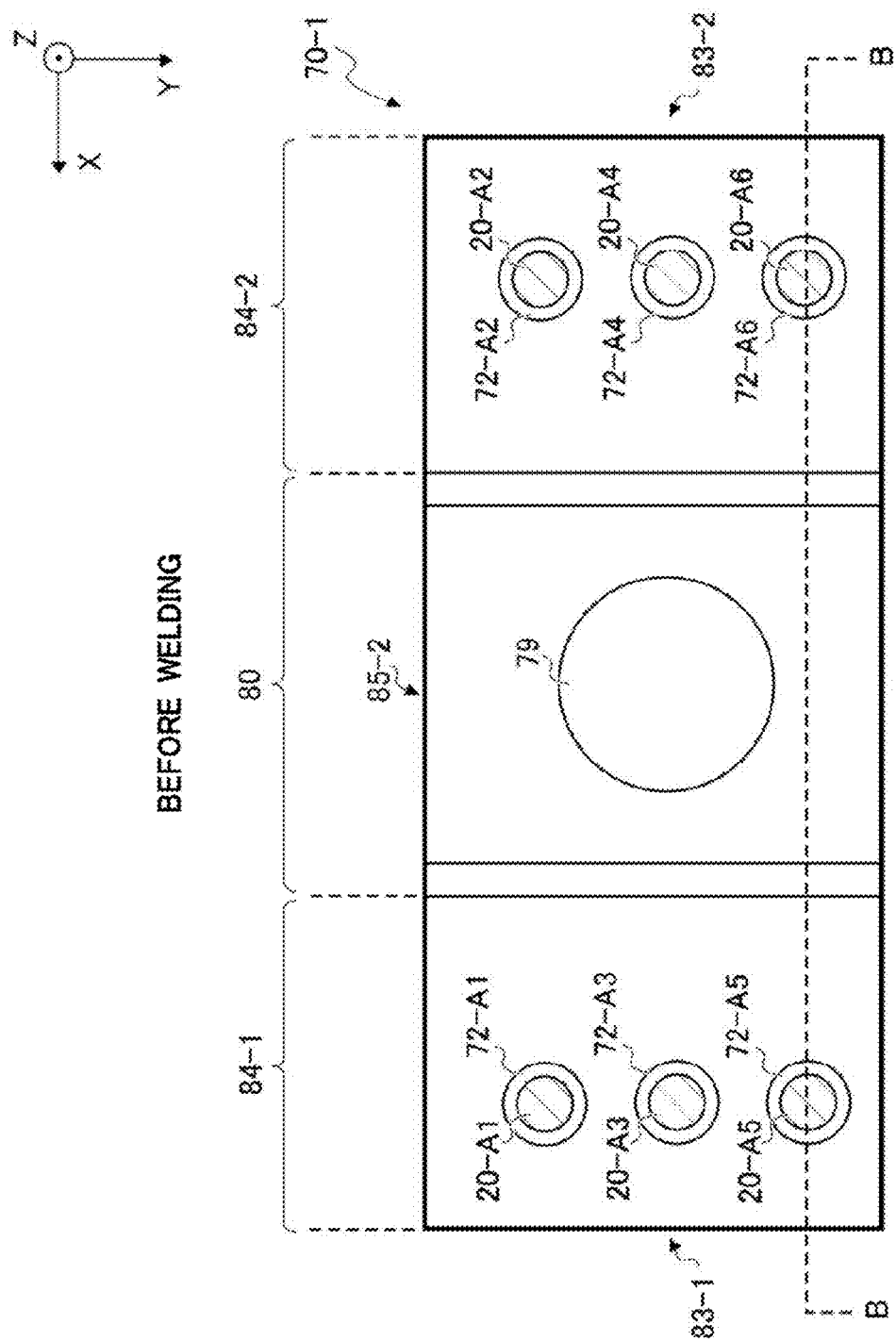

SEMICONDUCTOR DEVICE AND FABRICATION METHOD THEREOF

The contents of the following Japanese patent application(s) are incorporated herein by reference:
NO. 2017-166275 filed in JP on Aug. 30, 2017.

BACKGROUND

1. Technical Field

The present invention relates to a semiconductor device and a fabrication method thereof.

2. Related Art

Bonding a bus bar and an external connection terminal of a semiconductor module by laser welding has been known (refer to Patent Document 1, for example).

PRIOR ART DOCUMENT

Patent Document

Patent Document 1: Japanese Patent Application Publication No. 2014-236150.

If a crack occurs in a fusing portion between a bus bar and a connection terminal, there is a risk that electrical connection between the bus bar and the connection terminal is reduced.

SUMMARY

In the first aspect of the present invention, a semiconductor device is provided. The semiconductor device may include one or more connection terminals, a bus bar, and one or more fusing portions including a jointing portion. A connection terminal may be electrically connected to a semiconductor chip. There may be an opening on the bus bar. The connection terminal may pass through the opening. The jointing portion may be provided over an upper surface of the bus bar from an upper part of the connection terminal. As the connection terminal passes through the opening of the bus bar, the upper part thereof may be positioned above the upper surface of the bus bar.

A fusing portion may have a jointing portion. The jointing portion may be provided in a clearance between a side surface of the connection terminal and a side surface of the opening of the bus bar. The jointing portion may be a part of the connection terminal that is welded to the bus bar. Also, the fusing portion may have a non-jointing portion. The non-jointing portion may be positioned opposite to the jointing portion, in a direction orthogonal to a length direction of the connection terminal. The non-jointing portion may be a part of the connection terminal that is not welded to the bus bar.

A length from an upper end of the fusing portion to the upper surface of the bus bar may be 0.1 mm or longer.

A length from the upper end of the fusing portion to the upper surface of the bus bar may be 0.9 mm or shorter.

When the connection terminal and the bus bar are seen from above, an outline of the connection terminal may partially be in a circular shape. In a region where the fusing portion and the connection terminal overlap each other, a length of an arc defined by a center and a radius of the circular shape of the connection terminal may be between 0.75 mm and 2.50 mm inclusive. Also, in the region where the fusing portion and the connection terminal overlap each other, a sectorial shaped central angle that is defined by the center and the radius of the circular shape of the connection terminal may be between 86 degrees and 287 degrees inclusive.

When the connection terminal and the bus bar are seen from above, a ratio of a diameter of the connection terminal to a diameter of the opening of the bus bar may be between 0.907 and 0.991 inclusive.

The connection terminal may include a first body part, a first plated layer and a second plated layer. The first body part may contain copper material. The first plated layer may be provided on a surface of the first body part. The first plated layer may contain nickel material. The second plated layer may be provided on a surface of the first plated layer. The second plated layer may contain tin material.

The connection terminal may include a taper part. The taper part may be provided from the upper part of the connection terminal to a predetermined height position in a length direction of the connection terminal.

When the connection terminal and the bus bar are seen from above, the taper part of the connection terminal and a center of the fusing portion may overlap each other.

When the one or more connection terminals and the bus bar are seen from above, one of the one or more fusing portions may be provided to each of the connection terminals.

The bus bar may have a taper part in its opening. At an edge of a lower surface that is opposite to an upper surface of the bus bar, the taper part may make a diameter of the opening to become small from the lower surface toward the upper surface.

When the bus bar is seen from above, the semiconductor device may have the fusing portion on the bus bar. The fusing portion may be provided off-centered from a center of the connection terminal in a certain direction.

When the bus bar is seen from above, the semiconductor device may have a plurality of fusing portions on the bus bar. The plurality of fusing portions may be provided side by side in a first direction. Each of the plurality of fusing portions may be provided off-centered from the center of a connection terminal to the same certain direction in the first direction.

When the bus bar is seen from above, the semiconductor device may have a first number of the fusing portions and a second number of the fusing portions on the bus bar. The first number of the fusing portions may be provided side by side in the first direction. The second number of the fusing portions may be provided to be spaced apart from the first number of the fusing portions in a second direction. The second number of the fusing portions may also be provided side by side in the first direction. The second direction may be orthogonal to the first direction. Each of the first number of the fusing portions and each of the second number of the fusing portions may be provided off-centered from a center of a connection terminal to the same certain direction in the first direction.

The bus bar may include a convex. There may be a connection opening on the convex. A connection opening may be a connection opening through which a fixing member to fix the bus bar and an external connection terminal passes. A top part of the convex may be positioned above an upper end of the connection terminal.

When the bus bar is seen from above, the bus bar may be in a rectangular shape having a short side and a long side. The semiconductor device may have the first number of the fusing portions and the second number of the fusing portions. The first number of the fusing portions may be provided on a first side of the convex in a direction parallel with the long side. The first number of the fusing portions may be provided side by side in a direction parallel with the short side. The second number of the fusing portions may be provided on a second side of the convex in a direction parallel with the long side. The second side may be a side that is opposite to the first side. The second number of the fusing portions may be provided side by side in a direction parallel with the short side. Each of the first number of the fusing portions and each of the second number of the fusing portions may be provided off-centered from a center of a connection terminal to the same certain direction in the short side direction.

A lower surface of the top part of the convex may be positioned above an upper surface of a flat part of the bus bar other than the convex of the bus bar.

In the second aspect of the present invention, a fabrication method of the semiconductor device is provided. The fabrication method of the semiconductor device may include, making the connection terminal pass through the opening of the bus bar, and forming the fusing portion. The connection terminal may be electrically connected to a semiconductor chip. The fusing portion may include the jointing portion. The fusing portion may be formed by irradiating the taper part of the connection terminal with laser light, which is positioned above the upper surface of the bus bar. A connecting portion may be formed over the upper surface of the bus bar from the upper part of the connection terminal.

The summary clause does not necessarily describe all necessary features of the embodiments of the present invention. The present invention may also be a sub-combination of the features described above.

BRIEF DESCRIPTION OF THE DRAWINGS

FIG. 16A is a top view of a bus bar 70-1 and connection terminals 20-A1 to 20-A6 before welding.

DESCRIPTION OF EXEMPLARY EMBODIMENTS

Hereinafter, the present invention is described through embodiments of the invention. However, the following embodiments shall not limit the claimed invention that follows. Also, not all the combinations of the features described in the embodiments are necessarily essential to means provided by aspects of the invention.

Figure 1:
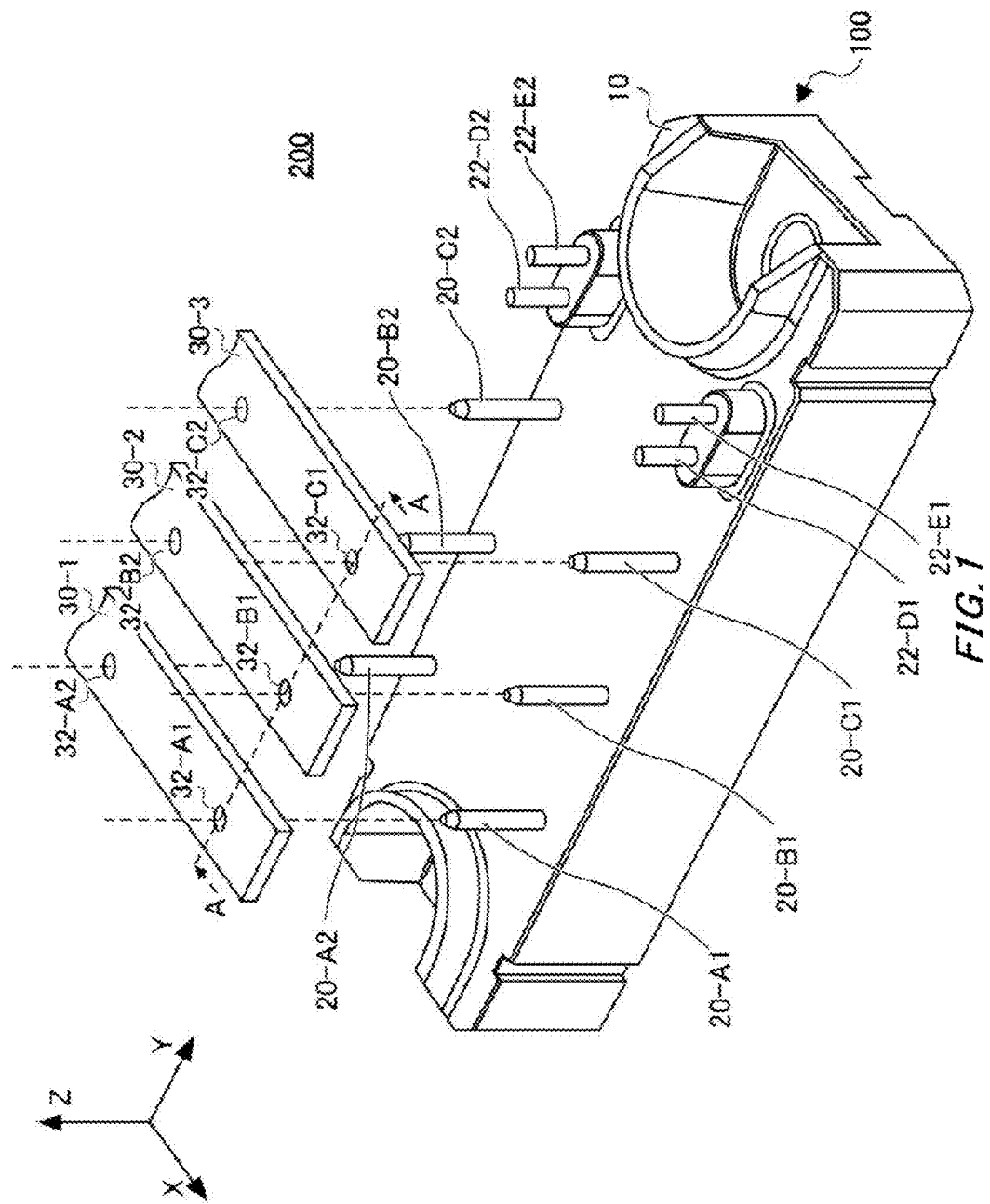
FIG. 1 is a perspective view illustrating a part of a power semiconductor device 200 in the first embodiment.

FIG. 1 is a perspective view illustrating a part of a power semiconductor device 200 in the first embodiment. The Z axis in the present example is an axis orthogonal to the X axis and the Y axis. The X, Y, and Z axes in the present example configure the right-handed system. The X, Y, and Z axes are used for indicating relative directions in the power semiconductor device 200. Thus, the Z axis direction may not necessarily be parallel with the gravitational direction. In the present specification, although phrases such as "above" and "below" are used as phrases to indicate directions that are parallel with the Z axis direction, these phrases shall not limit the directions to vertical directions in the gravitational direction either.

The power semiconductor device 200 may include one or more power semiconductor modules 100 and a plurality of bus bars 30. Illustrated in FIG. 1 is the power semiconductor device 200 having connection terminals 20 and the bus bars 30 before being welded together. Note that, in FIG. 1, although one power semiconductor module 100 that is positioned at the end of the +X direction is illustrated, the power semiconductor device 200 may have a plurality of power semiconductor modules 100 that are provided side by side in the X axis direction.

The power semiconductor module 100 in the present example has so-called 2 in 1 (two-in-one) structure. In the configuration, an upper arm and a lower arm may have a power MOSFET (Metal Oxide Semiconductor Field Effect Transistor) semiconductor chip and a FWD (Free Wheeling Diode) semiconductor chip, respectively, which are connected reversely parallel with each other.

The power semiconductor module 100 may have a plurality of connection terminals 20. The power semiconductor module 100 of the present example has a plurality of connection terminals 20 and a plurality of connection terminals 22 respectively protruding from an upper surface of a resin case 10 in +Z direction.

In the present example, connection terminals 20-A1 and 20-A2 are drain terminals, connection terminals 20-B1 and 20-B2 are source terminals, and connection terminals 20-C1 and 20-C2 are output terminals. The output terminals may output current to a motor from an electrical contact between a source of the upper arm and a drain of the lower arm, and may be the U-phase (or the V-phase or the W-phase) output terminal in the three-phase inverter circuit.

There may be openings 32 on the bus bars 30 through which the connection terminals 20 pass. The openings 32 of the present example are through-openings made in cylindrical shapes. The bus bars 30 may serve as conductive members placed between the connection terminals 20 and external connection terminals (not shown), or may also serve as external connection terminals. There are openings 32-A1 and 32-A2 on a bus bar 30-1 of the present example, which correspond to the connection terminals 20-A1 and 20-A2 respectively. The bus bar 30-1 may electrically connect a plurality of drain terminals to each other, and may serve as a connection having drain potential in the power semiconductor module 100.

Similarly, there are openings 32-B1 and 32-B2 on a bus bar 30-2, which correspond to the connection terminals 20-B1 and 20-B2 respectively, and the bus bar 30-2 may electrically connect a plurality of source terminals to each other. The bus bar 30-2 may serve as a connection having source potential in the power semiconductor module 100. Also, there are openings 32-C1 and 32-C2 on a bus bar 30-3, which correspond to the connection terminals 20-C1 and 20-C2 respectively, and the bus bar 30-3 may electrically connect a plurality of output terminals to each other. The bus bar 30-3 may serve as an output in the power semiconductor module 100.

Connection terminals 22-D1 and 22-D2 may be source sensing terminals for sensing current that flows between the drain and the source. Connection terminals 22-E1 and 22-E2 may be gate terminals for supplying on/off control signals to a gate of the power MOSFET. The connection terminals 22-D1 and 22-D2 may be electrically connected to each other, not by the bus bar 30 but by a wiring substrate (not shown). Similarly, the connection terminals 22-E1 and 22-E2 may be electrically connected to each other by a wiring substrate (not shown).

Figure 2:
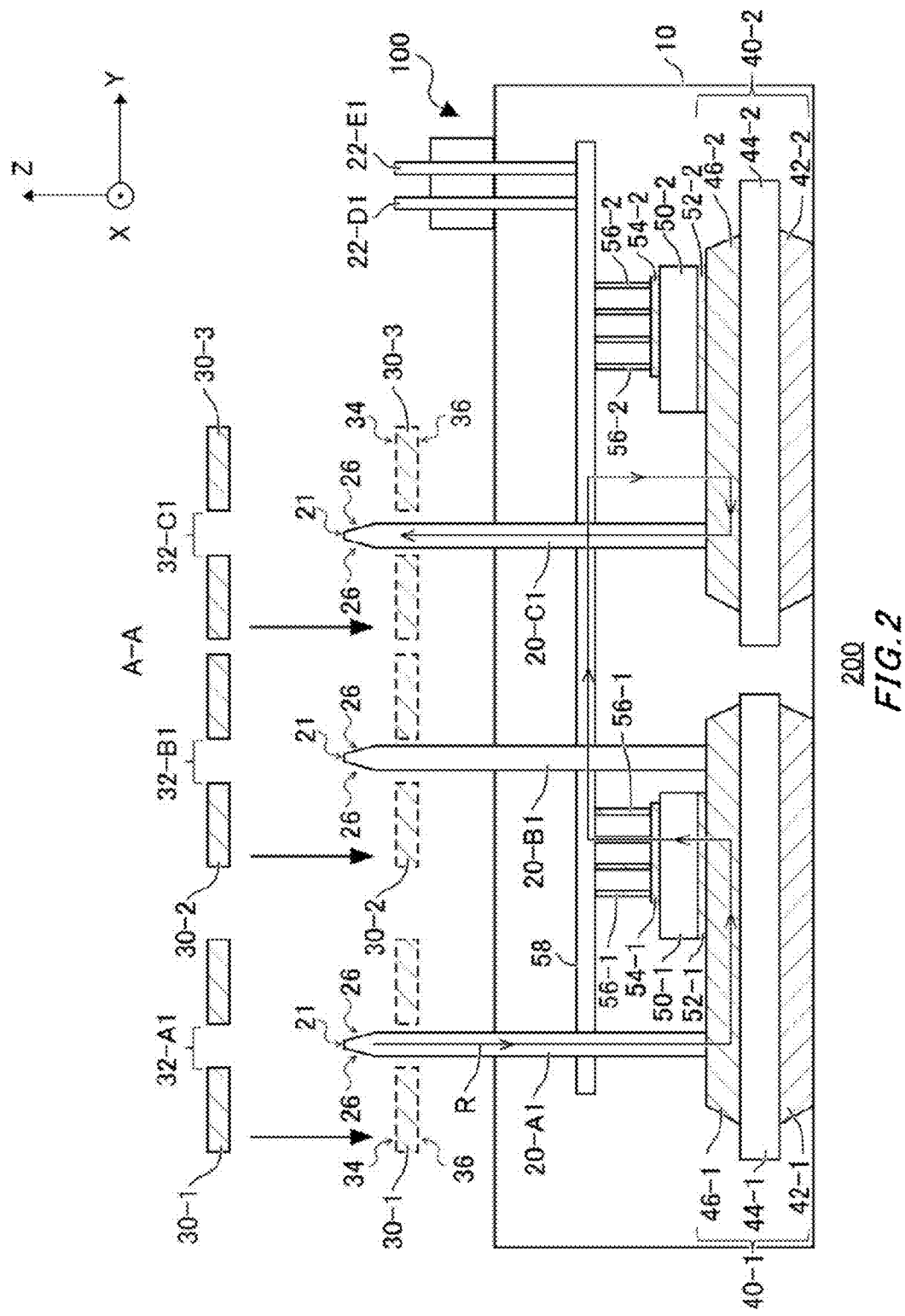
FIG. 2 is a drawing illustrating a cross section taken along A-A of FIG. 1.

FIG. 2 is a drawing illustrating a cross section taken along A-A of FIG. 1. The A-A cross section is a cross section parallel with a Y-Z plane that passes through the openings 32-A1, 32-B1, and 32-C1. In FIG. 2, the bus bars 30 being spaced apart above the connection terminals 20 are illustrated with the solid lines, and the bus bars 30 that have been passed through by the connection terminals 20 through their openings 32 are illustrated with the dashed lines. Note that, illustrated in FIG. 2 is also the power semiconductor device 200 having connection terminals 20 and the bus bars 30 before being welded together.

In the A-A cross section, the case 10, the connection terminals 20-A1, 20-B1, and 20-C1, the connection terminals 22-D1 and 22-E1, ceramic circuit substrates 40-1 and 40-2, semiconductor chips 50-1 and 50-2, solder layers 52-1, 52-2, 54-1, and 54-2, conductive pins 56-1 and 56-2, and a wiring substrate 58 are illustrated.

The ceramic circuit substrates 40 are one example of an insulation circuit substrate. The ceramic circuit substrates 40 of the present example include insulating substrates 44 having any of aluminum oxide ($Al_2O_3$), aluminum nitride (AlN), silicon nitride ($Si_3n_4$) and the like, and conductive layers 42 and conductive layers 46 which are in copper (Cu) wiring patterns to contact with upper surfaces and lower surfaces of the insulating substrates 44 respectively.

The conductive layers 42 to contact with the lower surfaces of the insulating substrates 44 may have functions to emit heat that is generated from the semiconductor chips 50 to the outside of the case 10. The conductive layers 46 to contact with the upper surfaces of the insulating substrates 44 may have functions to electrically connect the semiconductor chips 50 and the connection terminals 20.

The semiconductor chips 50 of the present example are power MOSFET semiconductor chips. Drain electrodes of the semiconductor chips 50 may be electrically connected to the conductive layers 46 via the solder layers 52. Also, source electrodes of the semiconductor chips 50 may be electrically connected to the wiring substrate 58 via the solder layers 54 and the conductive pins 56.

The wiring substrate 58 may be a printed wiring substrate having wiring patterns on its upper surface and lower surface. There may be openings on the wiring substrate 58 through which the connection terminals 20 pass. The connection terminals 20 may protrude from upper surfaces of the conductive layers 46 to the outside of the case 10 through the openings of the wiring substrate 58. The connection terminals 20 may be electrically connected to the semiconductor chips 50 at least via the conductive layers 46.

For example, if the semiconductor chip 50-1 to serve as the upper arm is turned on, current flows from the connection terminal 20-A1 to the connection terminal 20-C1 through a conductive layer 46-1, the semiconductor chip 50-1, the conductive pin 56-1, the wiring substrate 58, and a conductive layer 46-2. A flow of current in this case is illustrated with the solid line R. Also, for example, if the semiconductor chip 50-2 to serve as the lower arm is turned on, current flows from the connection terminal 20-B1 to the connection terminal 20-C1 through the semiconductor chip 50-2 etc.

Note that, semiconductor chips 50 in another example may be substituted by IGBT (Insulated Gate Bipolar Transistor) semiconductor chips, instead of the power MOSFET semiconductor chips. In addition, in yet another example, RC-IGBT (Reverse Conducting-IGBT) semiconductor chips having an IGBT part and a FWD part in every one semiconductor chip may be provided, instead of the power MOSFET semiconductor chips and FWD semiconductor chips. If the semiconductor chips 50 are IGBT semiconductor chips or RC-IGBT semiconductor chips, the source and drain in the description of FIG. 2 may be deemed to be replaced with an emitter and a collector, respectively. Note that, these semiconductor chips may also be Si semiconductors, or may also be wide bandgap semiconductors such as SiC semiconductors.

The connection terminals 20 may include taper parts 26. The taper parts 26 may be provided from top parts 21 to predetermined height positions in length directions. Lower ends of the taper parts 26 may have the same diameters as those of the connection terminals 20. The taper parts 26 may have angles between 20 degrees and 80 degrees inclusive, with the Z axis direction as reference. It is advantageous that, by providing the taper parts 26, work in an assembling process to make the connection terminals 20 pass through the openings 32 becomes easy, compared to a case in which there are no taper parts 26.

The bus bars 30 in the present example have upper surfaces 34 and lower surfaces 36 opposite to the upper surfaces 34. In a state in which the connection terminals 20 have passed through the openings 32, the top parts 21 of the connection terminals 20 may be positioned above the upper surfaces 34. In this case, the lower ends of the taper parts 26 may be positioned at the same level as the upper surfaces 34 of the bus bars 30, or above the upper surfaces 34. Parts of the connection terminals 20 positioned above the upper surfaces 34 may be fused by receiving laser light, in order to serve as so-called bonding material that physically and electrically connect the connection terminals 20 and the bus bars 30.

Figure 3:
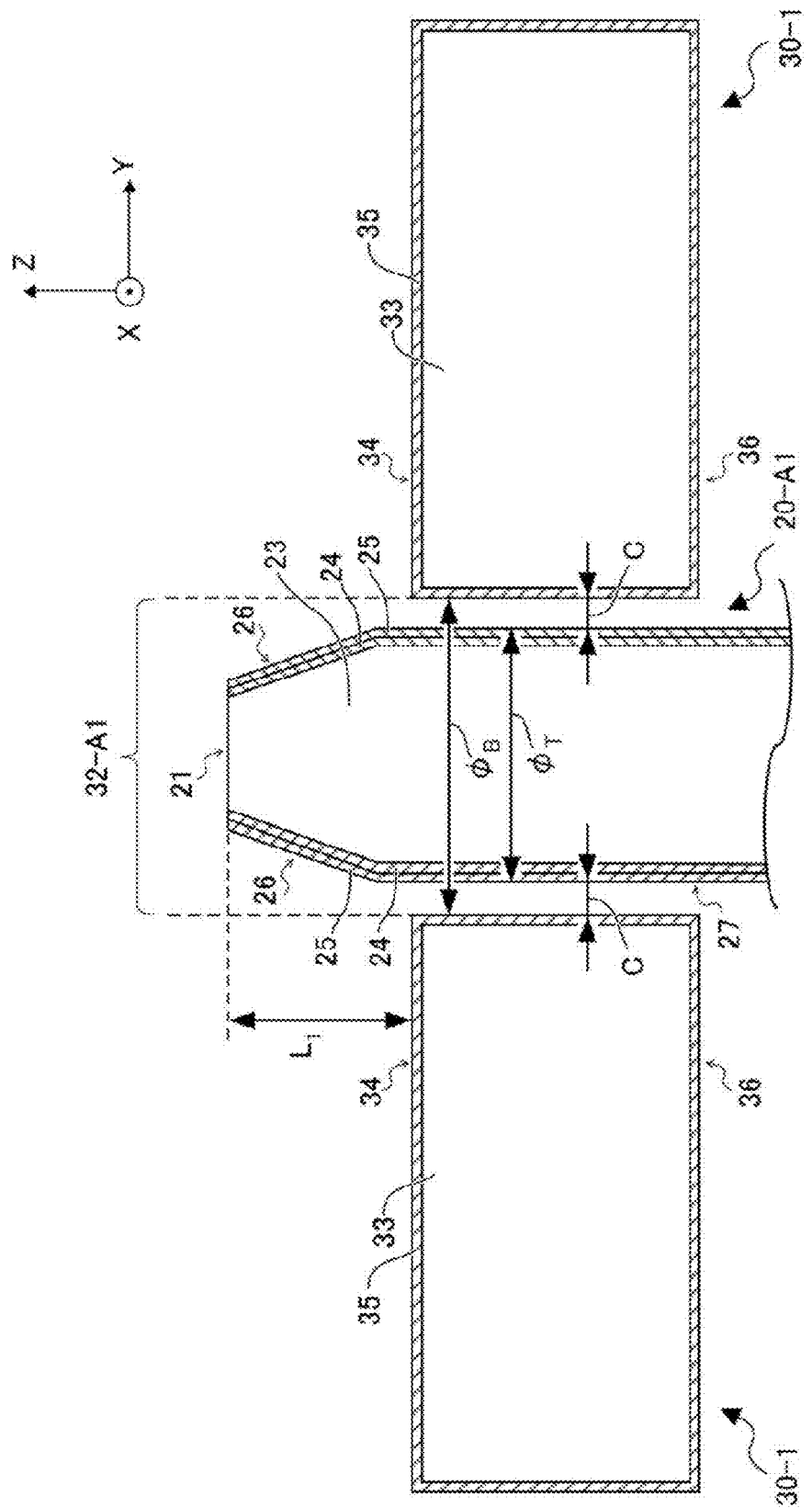
FIG. 3 is an enlarged cross sectional view of the vicinity of a top part 21 of a connection terminal 20-A1 in FIG. 2 before welding.

FIG. 3 is an enlarged cross sectional view of the vicinity of the top part 21 of the connection terminal 20-A1 in FIG. 2 before welding. FIG. 3 is a cross sectional view parallel with a Y-Z plane that passes through connection terminals 20 and bus bars 30. The connection terminals 20 of the present example include first body parts 23, first plated layers 24 provided on surfaces of the first body parts 23, and second plated layers 25 provided on surfaces of the first plated layers 24. The plurality of connection terminals 20 may be continuous terminals rolled into reel shapes and connected in series. The continuous terminals of the present example are provided with the first plated layers 24 and the second plated layers 25, and further provided with the taper parts 26 by punching. In the present example, each connection terminal 20 is formed by sequentially cutting off each of the continuous terminals by a predetermined length. Thus, the first plated layers 24 and the second plated layers 25 of the present example are provided to the taper parts 26 and circular pillars 27, but not provided to the top parts 21.

The first body parts 23 may contain copper material. The copper material may be so-called pure copper. The pure copper is, for example, any of Oxygen-Free Copper, Tough-Pitch Copper, and Phosphorous-Deoxidized Copper. It is advantageous that, by forming the first body parts 23 with copper material, electrical resistance of the connection terminals 20 is reduced and high heat dissipation effect can be obtained.

The first plated layers 24 may contain nickel (Ni) material, and the second plated layers 25 may contain tin (Sn) material. In regions coated by the first plated layers 24 and the second plated layers 25, oxidation of the first body parts 23 can be prevented. In addition, absorption efficiency of copper, nickel, and tin with respect to laser light having a wavelength of between 900 nm and 1,100 nm inclusive (for example, YAG laser light), are approximately 10%, approximately 28%, and approximately 45%, respectively. Thus, by providing nickel and tin plated layers, absorption efficiency of laser light irradiated on the connection terminals 20 can be increased compared to a case in which these are not provided. Furthermore, by providing tin plated layers on nickel plated layers, absorption efficiency of laser light can be increased compared to a case in which nickel plated layers are provided on tin plated layers.

Moreover, by increasing absorption efficiency of laser light, heat generated by absorption of the laser light is efficiently conveyed to the connection terminals 20. Thus, regions of connection terminals 20 to be fused by irradiation of laser light can be secured sufficiently. Once regions of the connection terminals 20 to be fused can be secured sufficiently, fusion bonding area between the fused connection terminals 20 and the bus bars 30 can be secured sufficiently.

Note that, if only nickel plated layers contacting the first body parts 23 and having predetermined thickness are provided, since nickel is comparatively hard metal, the hardness of fusing portions becomes high, and thus cracks are prone to occur in the fusing portions. Compared to this, in the present example, since plated layers having predetermined thickness with nickel plated layers and tin plated layers are provided, occurrence of cracks can be reduced. Also, in the present example, the hardness of fusing portions can be ensured compared to a case in which plated layers having predetermined thickness with only tin plated layers are provided.

The bus bars 30 in the present example include second body parts 33 containing copper material, and third plated layers 35 containing nickel material or tin material which is provided on surfaces of the second body parts 33. Note that, in another example, the third plated layers 35 may have laminated structures in which tin plated layers are provided on nickel plated layers. In a state in which the connection terminals 20 have passed through the openings 32, centers of openings 32 of the bus bars 30 and centers of the circular pillars 27 of the connection terminals 20 may be substantially coincident with each other. In the opening 32, a predetermined clearance C that is defined by difference between a hole diameter $\varphi_B$ of the opening 32 and a diameter $\varphi_T$ of the connection terminal 20 may be provided. The clearance C is distance between a side surface of the circular pillar 27 of the connection terminal 20 and a side surface of the opening 32 of the bus bar 30. Note that, the length of the connection terminal 20 to protrude from the upper surface 34 of the bus bar 30 is expressed with $L_1$.

Figure 4:
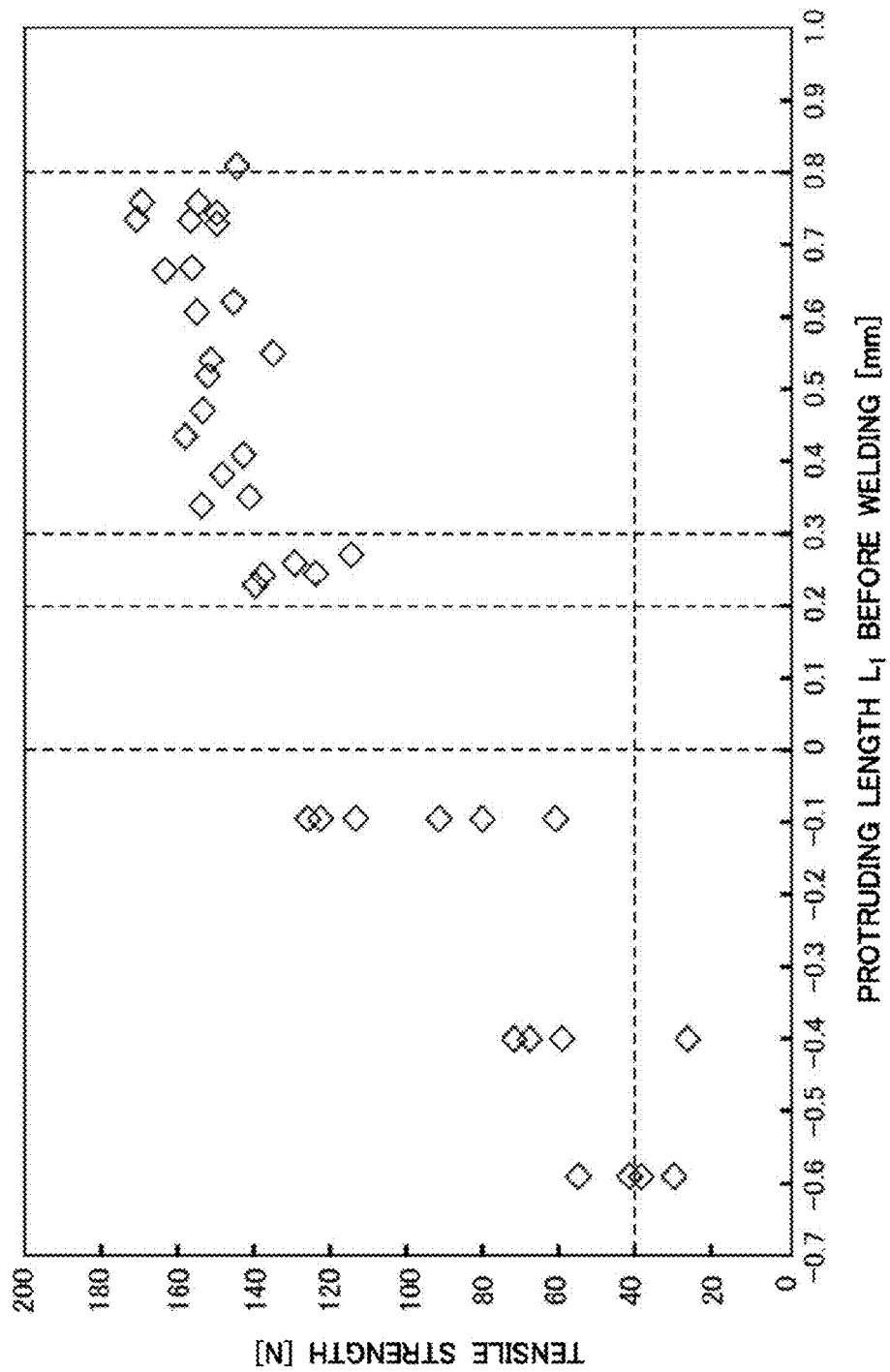
FIG. 4 is an experimental result illustrating a relation between protruding length $L_1$ and tensile strength before welding.

FIG. 4 is an experimental result illustrating relations between the protruding length $L_1$ and tensile strength before welding. The horizontal axis indicates the protruding length $L_1$ [mm] "before" welding. Compared to this, the vertical axis indicates tensile strength [N] that illustrates, "after" welding the connection terminals 20 to the bus bars 30 by irradiating laser light on the connection terminals 20, the strength needed to separate the bus bars 30 and the connection terminals 20 by pulling off the connection terminals 20 downwards from the bus bars 30.

In the present example, the plot with negative $L_1$ means that the top parts 21 of the connection terminals 20 were arranged below the upper surfaces 34 of the bus bars 30, and then the connection terminals 20 were welded subsequently. The plot with positive $L_1$ means that the top parts 21 of the connection terminals 20 were arranged above the upper surfaces 34 of the bus bars 30, and then the connection terminals 20 were welded subsequently. Also, in the present example, because fusing portions are formed by fusing the connection terminals 20, it may mean that the longer the length $L_1$ becomes, the more quantity of the bonding material used for the connecting portions is.

As apparent from the present experimental result, there is a tendency that the longer the length $L_1$ becomes, the more saturated tensile strength is. The protruding length $L_1$ before welding may be between 0.2 mm and 1.0 mm inclusive, and more preferably, it may be between 0.3 mm and 0.8 mm inclusive. If the length $L_1$ is less than 0.2 mm, variation in tensile strength becomes large, and stable quality cannot be obtained in the power semiconductor module 100. It is considered that, this is due to the protruding length being too short, which results in a shortage of bonding material to be fused by receiving laser light. In addition, if the length $L_1$ is less than 0.2 mm, because the taper parts 26 are positioned at about the same height as that of the upper surfaces 34 or positioned below the upper surfaces 34 of the bus bars 30, variation in clearances between the bus bars 30 and the connection terminals 20 can occur. Thereby, reduction in bonding strength between the bus bars 30 and the connection terminals 20 and increase in variation in the bonding strength occur. Compared to this, if the length $L_1$ is 0.2 mm or longer, stable bonding strength is obtained. Note that, if the length $L_1$ is 0.3 mm or longer, tensile strength is saturated at approximately 150 N. It is considered that, this is because sufficient bonding material has been obtained for completely covering portions that contribute to bonding.

Also, by making the length $L_1$ 1.0 mm or shorter, connection terminals 20 can be prevented from becoming obstruction of structures to be provided on bus bars 30. Moreover, since tensile stress does not increase in proportion to the protruding length $L_1$ even if $L_1$ is made larger than 0.8 mm before welding, the advantage of making $L_1$ larger than 0.8 mm is small.

Figure 5:
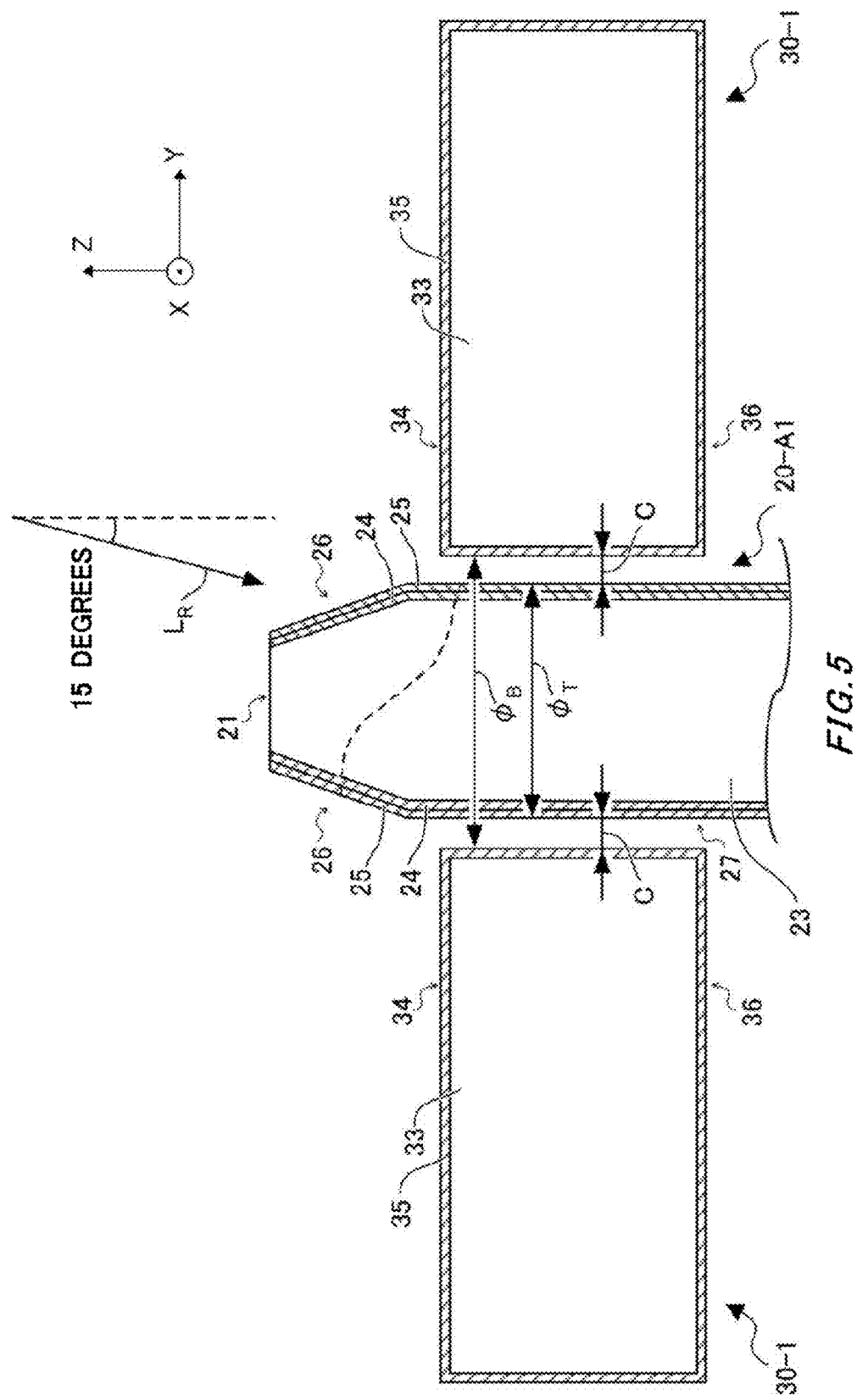
FIG. 5 is an enlarged drawing of the vicinity of the top part 21 of the connection terminal 20-A1 in FIG. 2 in a welding process.

FIG. 5 is an enlarged drawing of the vicinity of the top part 21 of the connection terminal 20-A1 in FIG. 2 in a welding process. In the present example, laser light is not irradiated parallel with the Z axis direction toward the top part 21, but instead, laser light $L_R$ is tilted at a predetermined angle from the Z axis direction and irradiated toward the taper part 26. In the Y-Z plane, laser light $L_R$ may be tilted from the Z axis direction to the +Y direction at a predetermined angle of between 10 degrees and 20 degrees inclusive, and may be irradiated toward the taper part 26 and a side surface of the circular pillar 27 in the +Y direction. In the present example, the laser light $L_R$ is tilted at 15 degrees to irradiate. In the present example, the laser light $L_R$ is irradiated at one point when seen from above. However, because the laser light $L_R$ has a predetermined spread, the laser light $L_R$ is also irradiated to the top parts 21 of the connection terminals 20 and the circular pillars 27. Output of the laser light $L_R$ may be between 50 J and 90 J inclusive, and irradiation time may be between 10 ms and 20 ms inclusive. Note that, an exemplary region of the connection terminal 20 to be heated with irradiation of the laser light $L_R$ is illustrated with the dashed line.

If the protruding length $L_1$ before welding is too long, heat to occur at the connection terminal 20 as it absorbs laser light $L_R$ becomes hard to be conveyed to a portion of the connection terminal 20 that is positioned at the vicinity of a height position of an upper surface 34 of a bus bar 30. As a result of this, a welding mark (also referred to as a nugget) is displaced from a predetermined position, and additionally, positional variation of a nugget in each connection terminal 20 becomes large. If the positional variation of a nugget becomes large, there is a possibility that intensity variation of the fusing portion also becomes large. Also, if the protruding length $L_1$ before welding is too long, the fused material of the connection terminal 20 becomes hard to flow into the clearance C. Moreover, when the laser light $L_R$ was irradiated toward the connection terminal 20 at the vicinity of the height position of the upper surface 34 of the bus bar 30, in some cases, a non-fused portion occurred near the top part 21 of the connection terminal 20 and the non-fused portion remained as a foreign matter. From this point also, it is desirable to make the length $L_1$ 1.0 mm or shorter, and more preferably, 0.8 mm or shorter.

Figure 6:
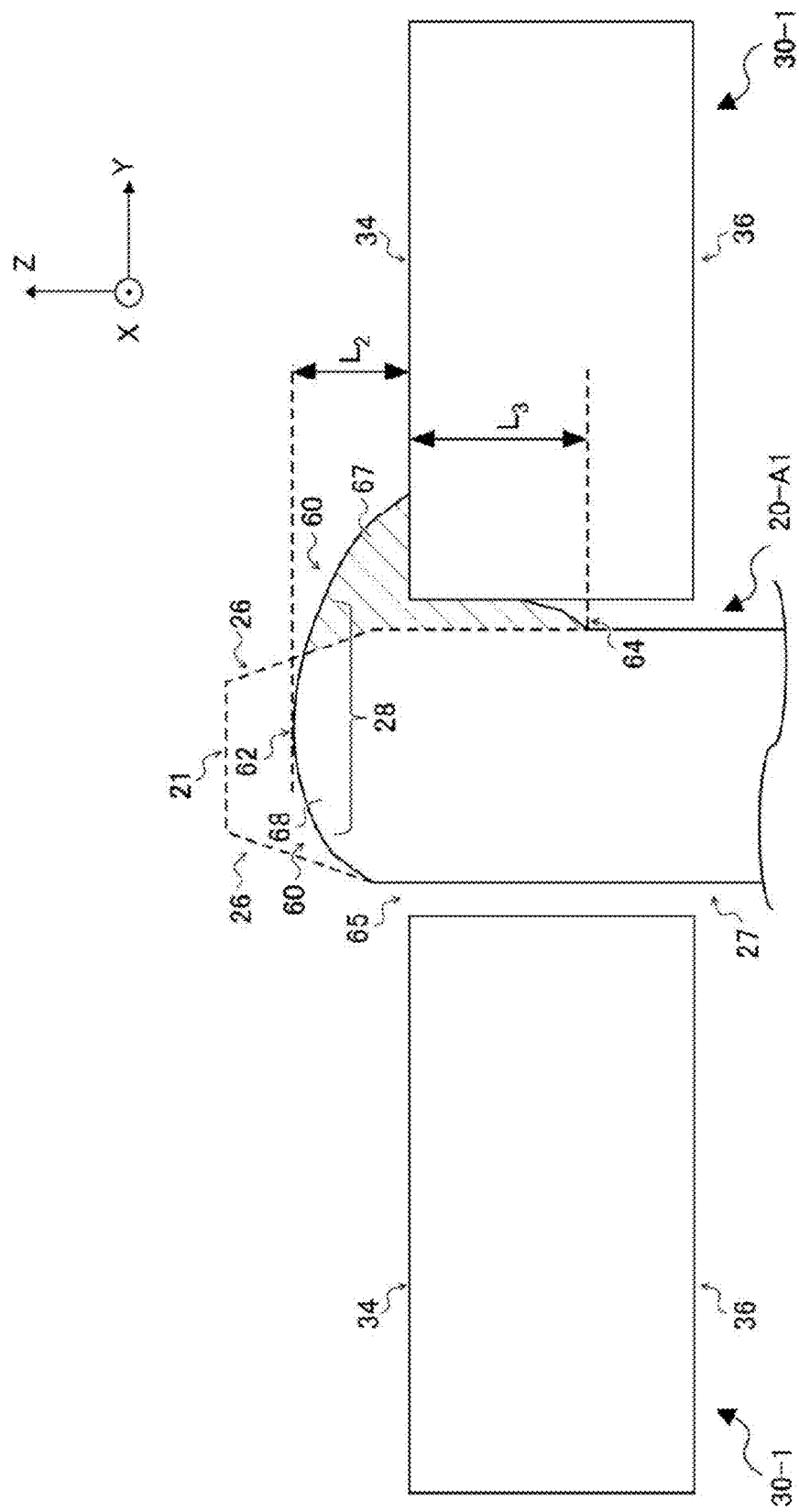
FIG. 6 is an enlarged drawing of the vicinity of the top part 21 of the connection terminal 20-A1 in FIG. 2 after welding.

FIG. 6 is an enlarged drawing of the vicinity of the top part 21 of the connection terminal 20-A1 in FIG. 2 after welding. In FIG. 6, for the purpose of facilitating understanding, the outline of the connection terminal 20 before welding is illustrated with the dashed lines. Also, in the welding process, an edge part of the connection terminal 20 is fused to flow out on the upper surface 34, as well as to flow into the clearance C. Illustrated with the oblique lines in FIG. 6 is a region of the connection terminal 20 after welding where expanded out from the outline of itself before welding. Note that, needless to say, the range of the connection terminal 20 that is fused by irradiation of the laser light may be wider than the oblique line portion.

The power semiconductor module 100 after welding has the fusing portions 60. A jointing portion 67 of the fusing portion 60 may be provided over the upper surface 34 of the bus bar 30 from an upper part 28 of the connection terminal 20 after welding. The fusing portion 60 may have gentle slope from an upper end 62 to the upper surface 34. For example, the fusing portion 60 has the upper part 28 (i.e., a convex region) with its peak height position being the upper end 62. By providing the fusing portion 60, fusion bonding area between the fused connection terminal 20 and the bus bar 30 can be secured sufficiently. Thereby, the possibility for cracks to occur in the fusing portion 60 between the bus bar 30 and the connection terminal 20 can be reduced, compared to a case in which the top part 21 of the connection terminal 20 before welding and the upper surface 34 are at height positions substantially the same as each other (for example, the difference between them is less than 0.2 mm).

In the fusing portion 60, an atomic percent of nickel to copper may be greater than 0 at % and equal to or less than 50 at %, and an atomic percent of tin to copper may be greater than 0 at % and equal to or less than 50 at %. The fusing portion 60 may include one or more kinds of $Cu_5Sn$, $Cu_3Sn$, and $Cu_6Sn_5$, which are chemical compounds of copper and tin, and may include one or more kinds of $Ni_3Sn$, $Ni_3Sn_2$, and $Ni_3Sn_4$, which are chemical compounds of nickel and tin.

The fusing portion 60 may include the jointing portion 67 which is a part of the connection terminal 20 that is fused and welded to the bus bar 30, and a non-jointing portion 68 which is a part of the connection terminal 20 that is fused but not welded to the bus bar 30. For example, the oblique line portion is the jointing portion 67. Also, in the region opposite to the region with the oblique lines in the Y axis direction, the taper part 26 that is provided from the upper part 28 to a predetermined height position is the non-jointing portion 68.

The non-jointing portion 68 of the present example is positioned opposite to the jointing portion 67 in the Y axis direction. In the present example, at the non-jointing portion 68 and below it, a gap 65 is remained where the connection terminal 20 and the bus bar 30 are not bonded. In a power cycle of the power semiconductor module 100, the connection terminal 20 is rapidly heated or rapidly cooled down, and accordingly, the connection terminal 20 repeats expanding and contracting to the bus bar 30. Thus, if circumference of the connection terminal 20 that is seen from above is enclosed with the jointing portion 67 to completely fix the connection terminal 20 and the bus bar 30 in the X-Y plane direction completely, distortion occurs in the fusing portion 60, which is derived from the power cycle. Thereby, cracks occur in the fusing portion 60 and the cracks gradually gets so large that, securing an electrical connection between the connection terminal 20 and the bus bar 30 is no longer possible. Compared to this, by providing the gap 65 as shown in the present example, cracks are suppressed from occurring in the fusing portion 60, and an electrical connection can be secured.

Length from the upper end 62 of the fusing portion 60 to the upper surface 34 after welding is expressed as $L_2$.

Because length of the connection terminal 20 to be fused by the welding process is approximately between 0.1 mm and 0.2 mm, the length $L_2$ may be shorter than the protruding length $L_1$ before welding. If the length $L_1$ of the connection terminal 20 becomes the length $L_2$ through the welding process, the length $L_2$ may be 0.1 mm or longer, or more preferably, it may be 0.2 mm or longer. By making 0.1 mm≤$L_2$, 40 N or more tensile strength can be secured, for example.

The length $L_2$ after welding may be 0.9 mm or shorter, and more preferably, it may be 0.7 mm or shorter. For example, if an external connection terminal is further provided on the bus bar 30, and once the external connection terminal contacts the fusing portion 60, the fusing portion 60 receives damage and contact resistance in the fusing portion 60 may increase. In the present example, by providing an upper limit to the length $L_2$, contact resistance in the fusing portion 60 can be suppressed from increasing, and the fusing portion 60 can be prevented from being a physical obstruction of the external connection terminal.

It should be noted that, the power semiconductor module 100 of the present example has the jointing portion 67 in the clearance C. By pouring the fused connection terminal 20 into the clearance C, bonding strength between the connection terminal 20 and the bus bar 30 can be improved, compared to a case in which only the vicinity of the top part 21 of the connection terminal 20 is welded. The length from the upper surface 34 to a lower end 64 of the fusing portion 60 after welding is expressed as $L_3$. The length $L_3$ may be between 0.5 and 1.0 times, inclusive, of thickness of the bus bar 30 in the Z axis direction, and may also be between ½ and ¾ of the thickness, inclusive, or between ½ and ⅔ of the thickness, inclusive.

Figure 7:
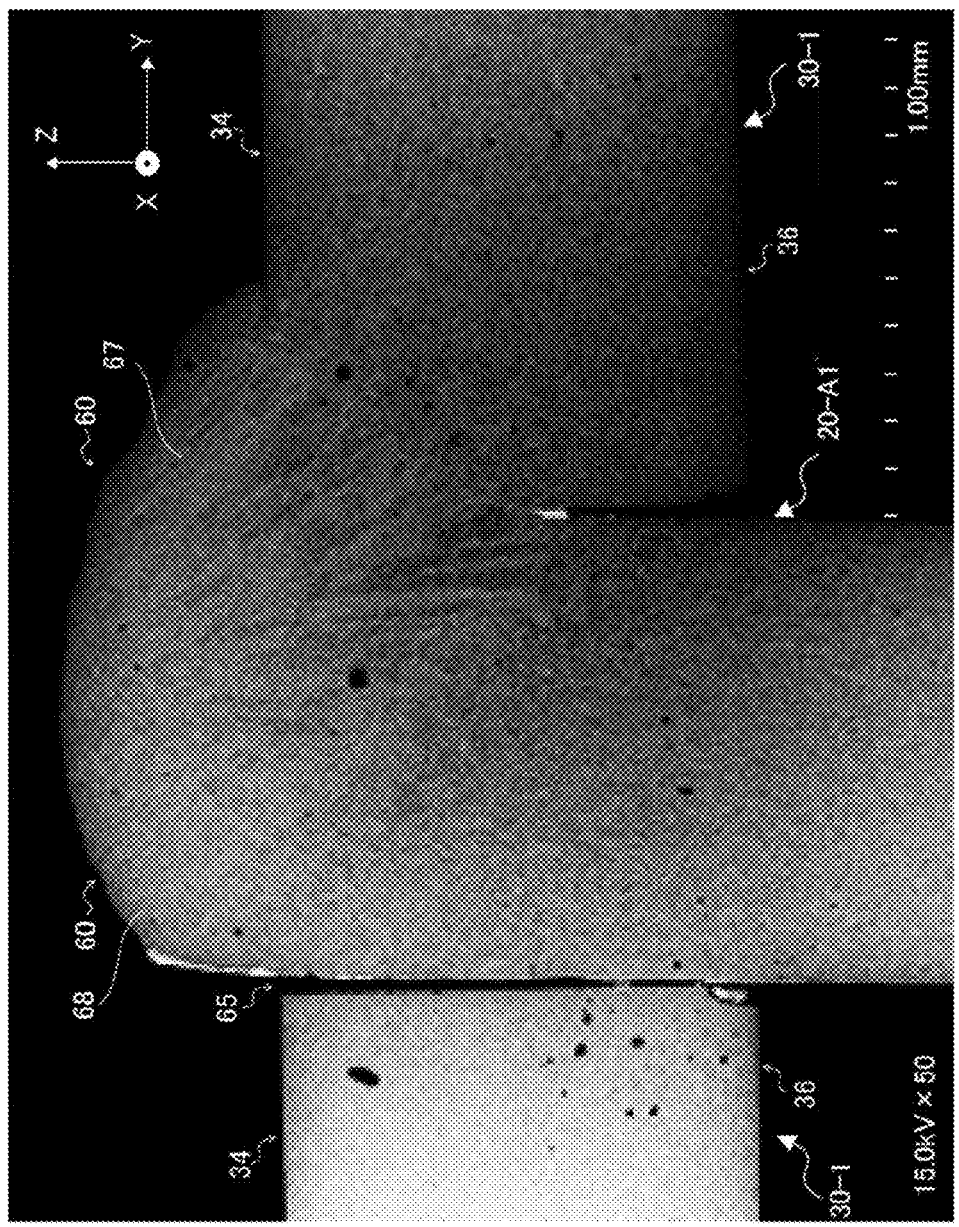
FIG. 7 is a cross sectional photograph of the connection terminal 20-A1, a bus bar 30-1, and a fusing portion 60.

FIG. 7 is a cross sectional photograph of the connection terminal 20-A1, the bus bar 30-1, and the fusing portion 60. The photograph shown in FIG. 7 corresponds to FIG. 6.

Figure 8:
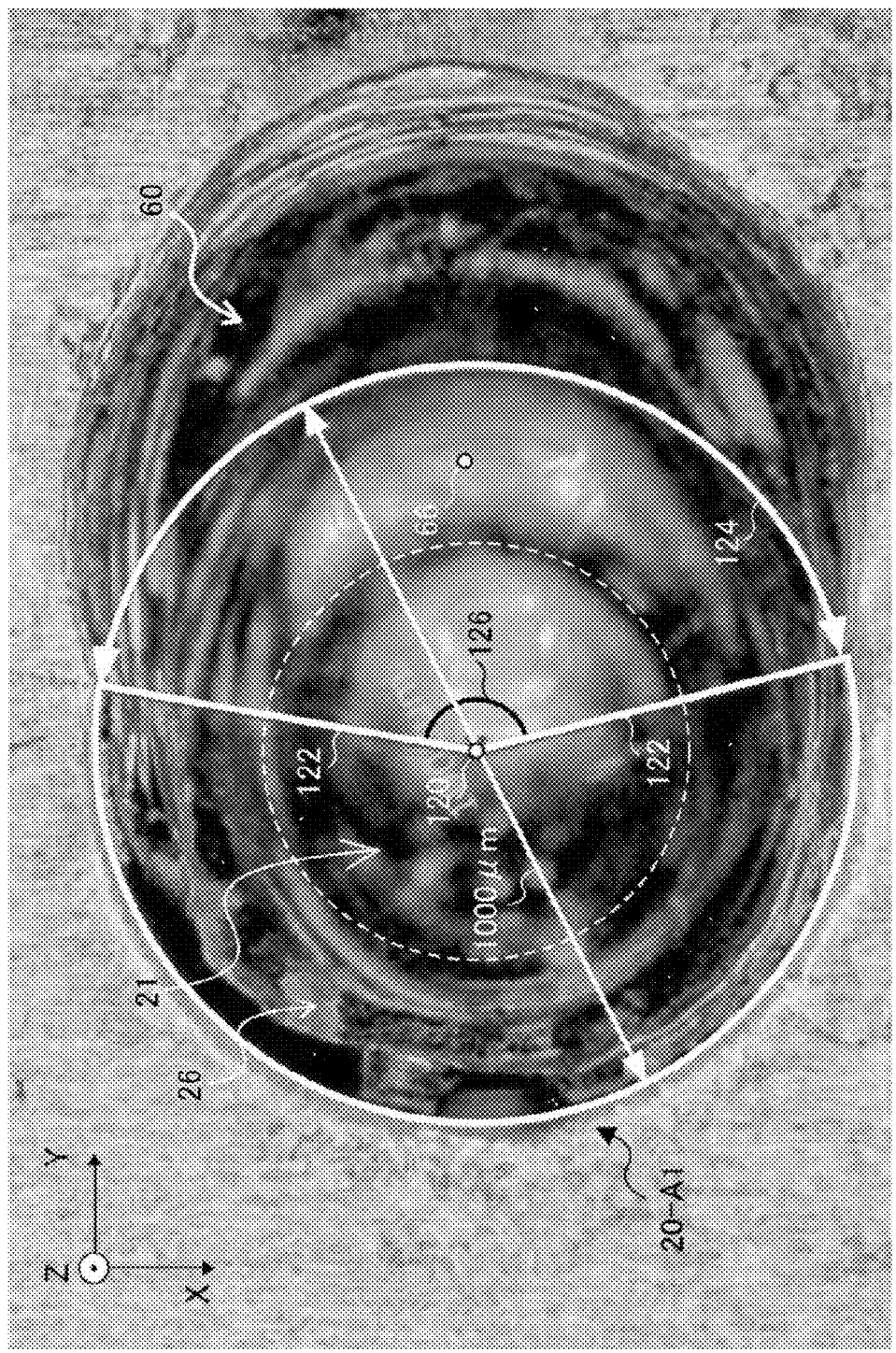
FIG. 8 is a photograph of the connection terminal 20-A1, the bus bar 30-1 and the fusing portion 60 taken from above.

FIG. 8 is a photograph of the connection terminal 20-A1, the bus bar 30-1, and the fusing portion 60 taken from above. FIG. 8 is also a photograph of the fusing portion 60 before being cut off, taken from above. FIG. 8 is a photograph of the connection terminal 20 and the bus bar 30 which are seen from above, with addition of a center 120, radiuses 122, an arc 124, and a central angle 126 of a circular shape of the connection terminal 20, as well as a boundary (the dashed line) between the top part 21 and the taper part 26 before the welding process, and the like. Note that, in FIG. 8, two-way arrows are illustrated for the arc 124 and the diameter respectively. In a region where the fusing portion 60 and the connection terminal 20 overlap each other, the outline of the connection terminal 20 is partially in a circular shape.

In the region where the fusing portion 60 and the connection terminal 20 overlap each other, the length of the arc 124 is defined by the center 120 and the radius 122 of the connection terminal 20. Also, in the region where the fusing portion 60 and the connection terminal 20 overlap each other, the sectorial shaped central angle 126 is defined by the center 120 and the radius 122 of the circular shape of the connection terminal 20. For example, if the diameter $\varphi_T$ of the connection terminal 20 is $\varphi_T$=1.00 mm (the two-way arrow straight line) and the central angle 126 of the connection terminal 20 is 118 degrees, the length of the arc 124 is approximately 1.03 mm (=(1.00/2)×(118/360)×2π).

As shown in FIG. 8, the taper part 26 of the connection terminal 20 and a center 66 of the fusing portion 60 may overlap each other. As described above, in the present example, the center of laser light is irradiated on the taper part 26 of the connection terminal 20. Thereby, since the laser light can be irradiated on the top part 21, the taper part 26, and the circular pillar 27, the heated range can be made large, and as a result, the fusing range of the connection terminal 20 can be made large, compared to a case in which the laser light is irradiated only on the top part 21 of the connection terminal 20.

In FIG. 8, the fusing portion 60 is observed as a nugget. Since the outline of the fusing portion 60 corresponds to the actual spread of the fused connection terminal 20, it may not be a perfect circle completely, and it may be in a substantially circular shape. The outline of the fusing portion 60 may be approximately in a circular shape, or may also be approximately in an ellipse shape. It is apparent from the drawing that, even if it is approximately in a circular shape, the center 66 of the fusing portion 60 is positioned in the taper part 26. Note that, the center 66 may be the power peak position of the laser light.

As shown in FIG. 8, in the present example, the fusing portions 60 are provided to the connection terminals 20 with a ratio of 1:1. One fusing portion 60 may mean that, there is one region where the welded connection terminal 20 is continuously provided to it when it is seen from above. It is advantageous that, by providing the fusing portions 60 to the connection terminals 20 with a ratio of 1:1, work time in the welding process can be reduced while intensity of the fusing portion 60 is secured.

Figure 9:
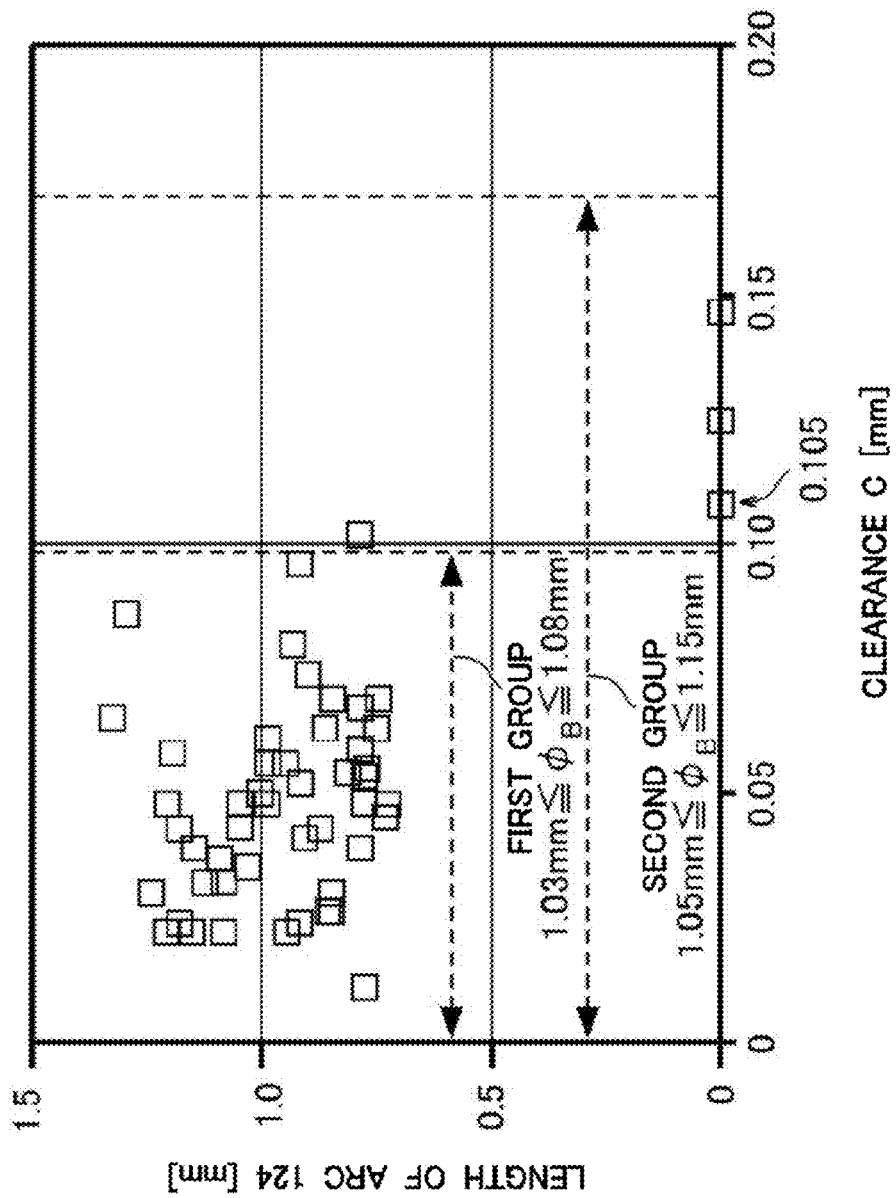
FIG. 9 is an experimental result illustrating a relation between a clearance C between a connection terminal 20 and a bus bar 30, and length of an arc 124 after welding.

FIG. 9 is an experimental result illustrating a relation between the clearance C between the connection terminal 20 and the bus bar 30, and length of the arc 124 after welding. The horizontal axis indicates the clearance C [mm], and the vertical axis indicates the length of the arc 124 [mm]. In the present experiment, the diameter $\varphi_T$ of the connection terminal 20 was between 0.98 mm and 1.02 mm inclusive. Also, a first group and a second group were prepared for the bus bar 30. The first group had a diameter $\varphi_B$ of the opening 32, which is between 1.03 mm and 1.08 mm inclusive, and the second group had a diameter ($\varphi_B$ of the opening 32, which is between 1.05 mm and 1.15 mm inclusive.

In the first group, the maximum value $C_{MAX}$ of the clearance C is 0.1 mm (=1.08 mm−0.98 mm) and the minimum value $C_{MIN}$ of the clearance C is 0.01 mm (=1.03 mm−1.02 mm). Compared to this, in the second group, the maximum value $C_{MAX}$ of the clearance C is 0.17 mm (=1.15 mm−0.98 mm), and the minimum value $C_{MIN}$ of the clearance C is 0.03 mm (=1.05 mm−1.02 mm).

As apparent from FIG. 9, once the clearance C was 0.105 mm or more, the arc 124 of the fusing portion 60 became small rapidly. In the present experiment, three samples existed in which the clearance C was 0.105 mm or more and the arc 124 was 0 mm, and all of them were the samples of the second group.

Compared to this, any samples of the first group had the arc 124 of 0.7 mm or longer in length. As reasonably estimated from the present experimental result, if a ratio of a diameter $\varphi_T$ to a diameter $\varphi_B$ is 0.907 (=0.98 mm/1.08 mm=the minimum value of $\varphi_T$/the maximum value of $\varphi_B$) or longer, and 0.991 (=1.02 mm/1.03 mm=the maximum value of $\varphi_T$/the minimum value of $\varphi_B$) or shorter, then length of an arc 124 is 0.7 mm or longer. As described below, if length of the arc 124 is 0.7 mm or longer, tensile strength can be 40 N or more.

Figure 10:
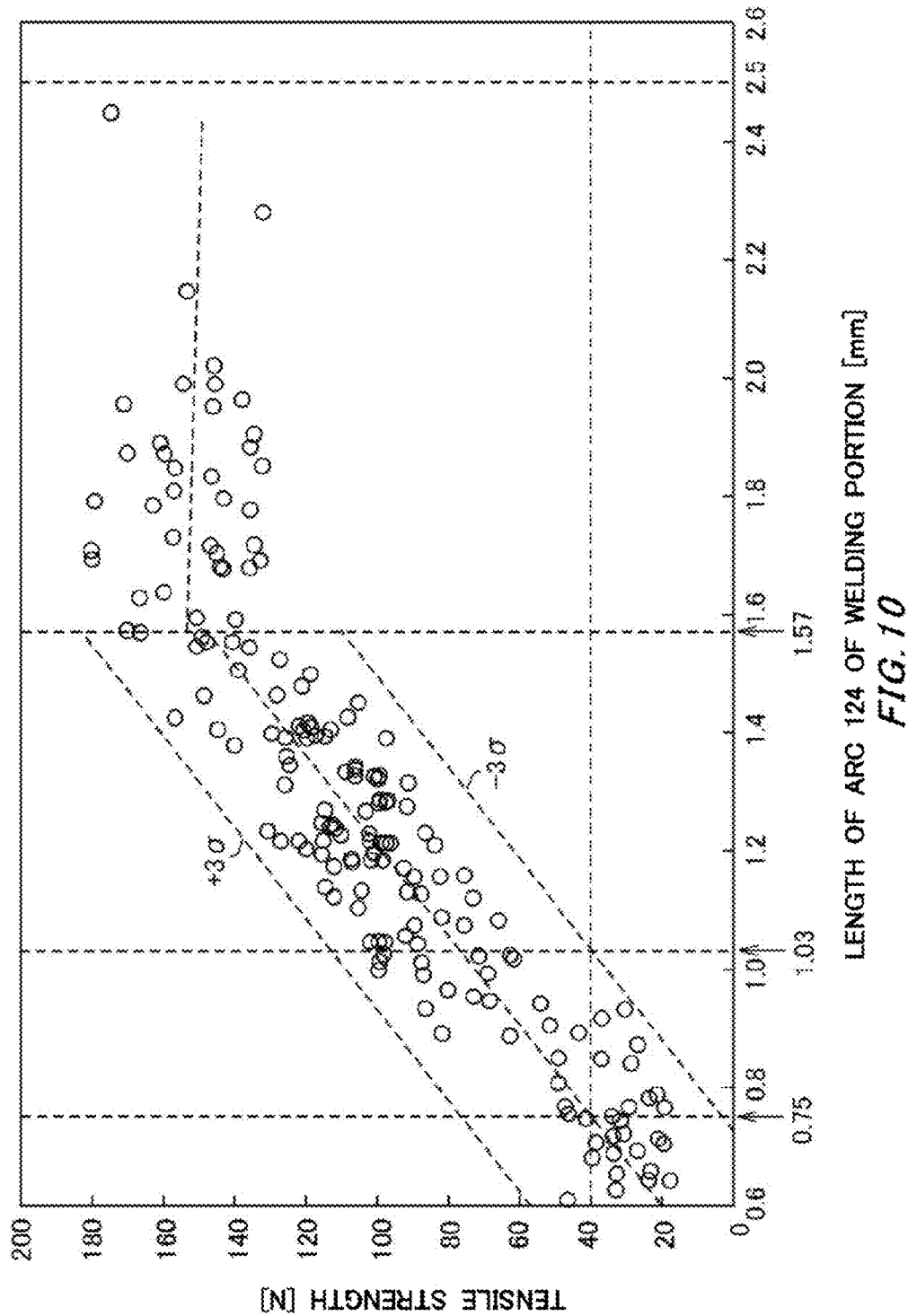
FIG. 10 is an experimental result illustrating relations between length of arcs 124 and tensile strength after welding.

FIG. 10 is an experimental result illustrating relations between length of the arcs 124 and tensile strength after welding. The horizontal axis indicates length of the arcs 124 [mm], and the vertical axis indicates tensile strength [N] which is the same as that in FIG. 4. In the present experiment, relations between length of the arcs 124 and tensile strength were measured for 179 samples. σ indicates standard deviation, and 3σ means three times the standard deviation. In FIG. 10, straight lines to indicate ±3σ are illustrated with the dashed lines, and a straight line to indicate a regression line is illustrated with the dashed line between the straight lines illustrating ±3σ. A correlation coefficient of the regression line was 0.904.

A length of the arc 124 may be between 0.75 mm and 2.50 mm inclusive, and more preferably, it may be between 1.03 mm and 1.57 mm inclusive. A length 0.75 mm of the arc 124 may be the minimal length required to achieve tensile strength of 40 N or more. For example, tensile strength that is calculated from the regression line is 40 N for the arc 124 of a length 0.75 mm. If the length of the arc 124 is longer than 2.50 mm, since the volume of the connection terminal 20 to be fused by laser light becomes comparatively large, the fused portion may pass beyond the thickness of the bus bar 30 in the Z axis direction, and may flow out from the lower surface 36 of the bus bar 30. This is not preferable, because a bonding defect may occur due to this outflow of metal, and the outflow of metal may cause damage to a sealing resin. By making the length of the arc 124 2.50 mm or shorter, a bonding defect and damage to the sealing resin can be prevented.

A length 1.03 mm of the arc 124 may be the minimal length required to achieve tensile strength of 40 N or more in the range of ±3σ. Also, by making the length of an arc 124 1.57 mm or shorter, tensile strength equivalent to that in a case in which a length of an arc 124 is made longer than 1.57 mm can be obtained, and of course, tensile strength of 40 N or more can be secured. In addition, by making the length of the arc 124 1.57 mm or shorter, the range of the fusing portion 60 can be made small, compared to a case in which the length of the arc 124 is made longer than 1.57 mm. Limiting the range of the fusing portion 60 is advantageous with respect to an irradiation range, amplitude of output, irradiation time, and the like of the laser light.

The sectorial shaped central angle 126 may be between 86 degrees and 287 degrees inclusive, and more preferably, it may be between 118 degrees and 180 degrees inclusive. If the central angle 126 is 86 degrees, it may correspond to the length 0.75 mm of the arc 124. Note that, approximately $0.75=((1.00/2) \times (86/360) \times 2\pi)$. Similarly, if the central angle 126 is 180 degrees, it may correspond to the length 1.57 mm of the arc 124 (approximately $1.57=((1.00/2) \times (180/360) \times 2\pi)$). Thereby, advantageous effect that is the same as effect derived from a length range of the arc 124 can be obtained.

Figure 11:
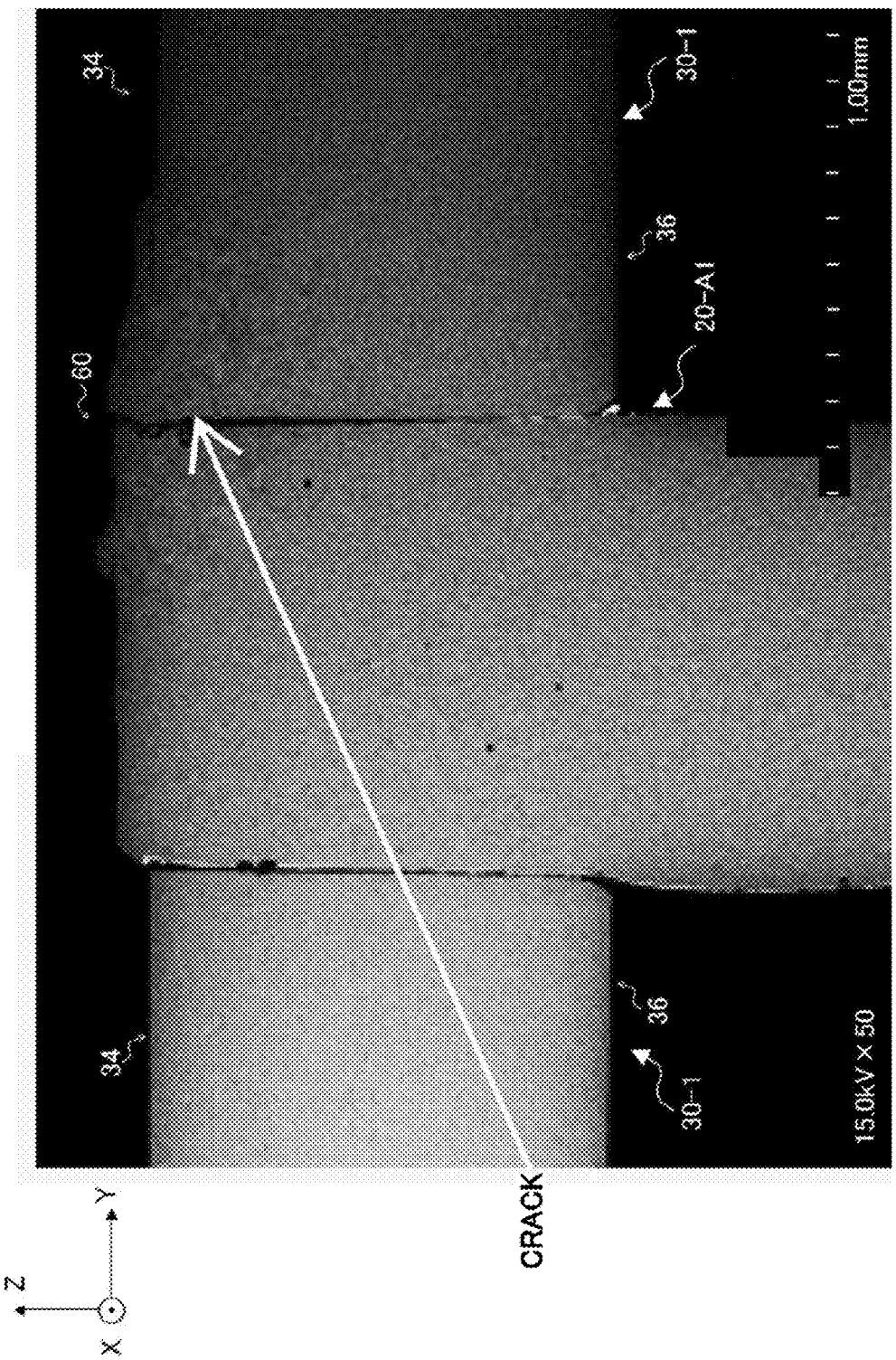
FIG. 11 is a cross sectional photograph of a connection terminal 20-A1, a bus bar 30-1, and a fusing portion 60 in a comparative example.

FIG. 11 is a cross sectional photograph of a connection terminal 20-A1, a bus bar 30-1, and a fusing portion 60 in a comparative example. In the present comparative example, height positions of a top part 21 of the connection terminal 20 and an upper surface 34 of the bus bar 30 are made to be coincident with each other, and then laser light was irradiated on a predetermined region over the top part 21 and the upper surface 34. It was observed that cracks had occurred directly below the fusing portion 60.

Figure 12:
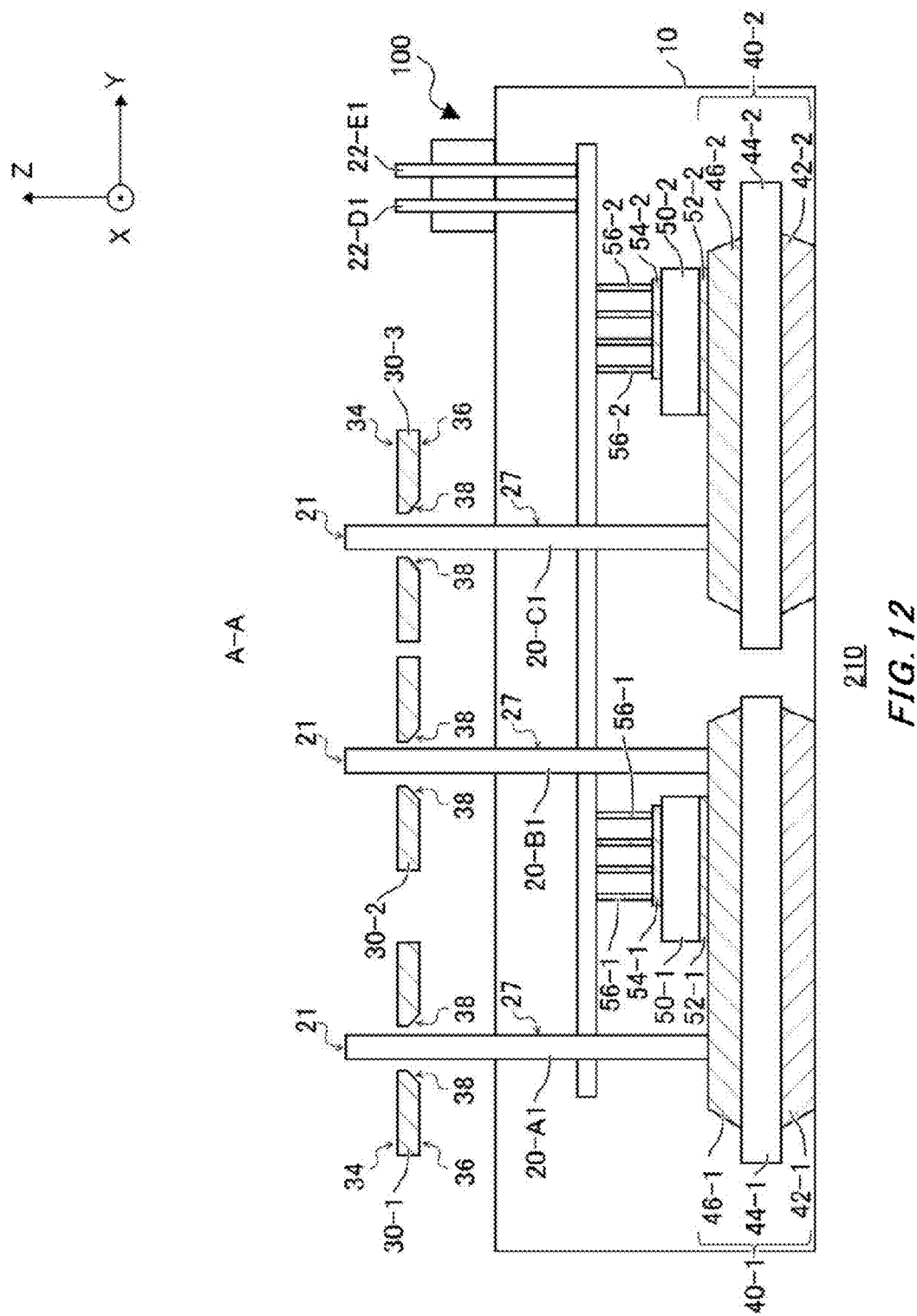
FIG. 12 is a drawing illustrating a cross section taken along A-A of a power semiconductor device 210 in the second embodiment.

FIG. 12 is a drawing illustrating a cross section taken along A-A of a power semiconductor device 210 in the second embodiment. Connection terminals 20 of the present example do not have taper parts 26. The connection terminals 20 of the present example are composed of top parts 21 and circular pillars 27. In the present example, there are taper parts 38 in openings 32 of bus bars 30 at edges of their lower surfaces 36. Because it is facilitated to insert the connection terminals 20 to the openings 32 of the bus bars 30 by providing the taper parts 38, assembly of the power semiconductor device 210 becomes easy compared to a case in which the taper parts 38 are not provided.

The taper parts 38 may make diameters of the openings 32 to become small from the lower surfaces 36 toward upper surfaces 34. In parts of the openings 32 of the present example, the taper parts 38 are provided to reach predetermined height positions from the lower surfaces 36 in the +Z direction, and the rest of the portions are provided with cylindrical portions illustrated in the first embodiment. More specifically, the lower half and the upper half in the Z axis direction are the taper parts 38 and the cylindrical portions respectively. Note that, the present embodiment having the bus bars 30 that are provided with the taper parts 38 may be combined with the first embodiment.

Figure 13:
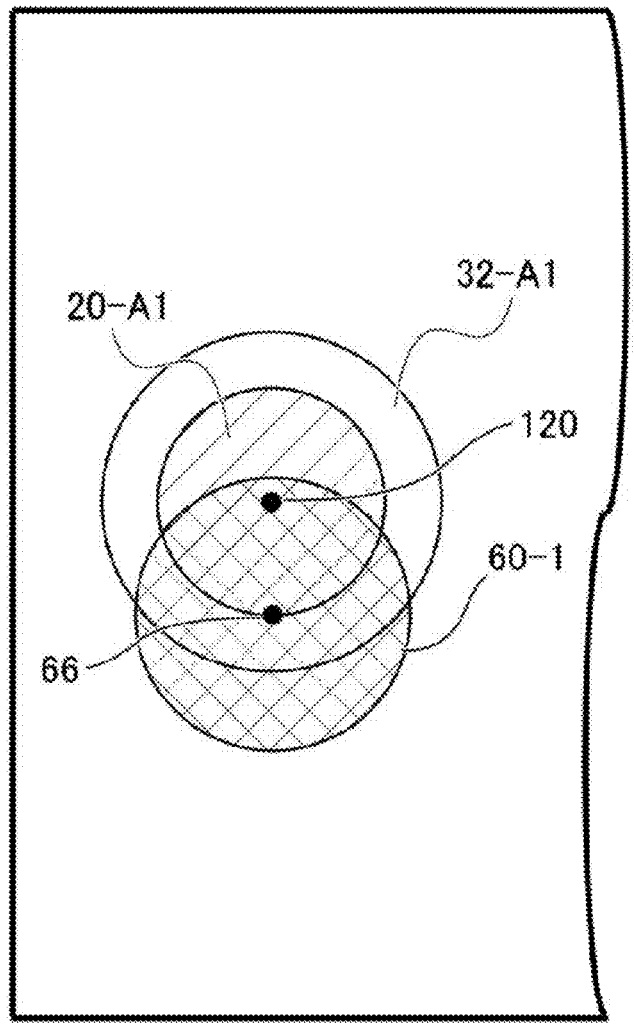
FIG. 13 is a top view of a bus bar 30-1 and one connection terminal 20-A1 after welding.

FIG. 13 is a top view of a bus bar 30-1 and one connection terminal 20-A1 after welding. FIG. 13 is also a drawing of the bus bar 30-1 that is seen from above. Note that, in FIG. 13, right side of the bus bar 30-1 is omitted. Similar to the example of FIG. 8, a center 66 of a fusing portion 60 that is provided on the bus bar 30-1 may be provided off-centered from a center 120 of the connection terminal 20-A1 in a certain direction. In the present example, the center 66 of the fusing portion 60 does not overlap with the center 120 of the connection terminal 20, and is off-centered from the center 120 in the +Y direction. In the present example, the connection terminal 20 is provided with hatching, and the fusing portion 60 is provided with cross-hatching.

Figure 14:
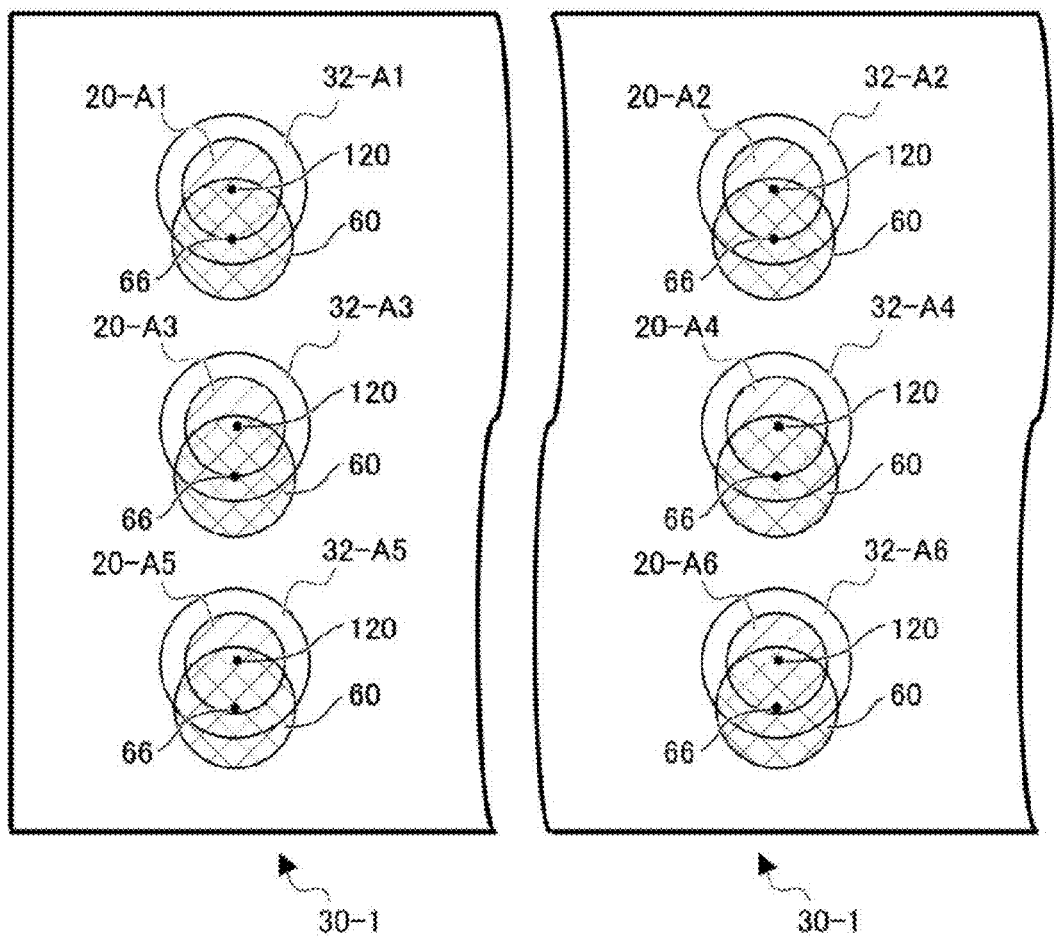
FIG. 14 is a top view illustrating a first modification example of a bus bar 30-1 and a plurality of connection terminals 20 after welding.

FIG. 14 is a top view illustrating a first modification example of the bus bar 30-1 and a plurality of connection terminals 20 after welding. A power semiconductor module 100 of the present example has connection terminals 20. Six of which correspond to a drain terminal, a source terminal, and an output terminal respectively, instead of two of which correspond to them respectively. There are a plurality of opening 32-A1, 32-A3, and 32-A5 on the bus bar 30-1 of the present example, which are provided side by side in the short side direction of the bus bar 30-1. Also, there are a plurality of openings 32-A2, 32-A4, and 32-A6 on the bus bar 30-1 of the present example, has which are provided to be spaced apart from the plurality of opening 32-A1, 32-A3, and 32-A5 in a long-side direction of the bus bar 30-1, and to be side by side in a short side direction. Moreover, the connection terminals 20 are provided corresponding to the openings 32 of the present example.

In the present example, the short side direction is parallel with the Y axis direction, and the long-side direction is parallel with the X axis direction. Also, one example of the first direction is the Y axis direction, and one example of the second direction is the X axis direction.

In the present example also, a plurality of fusing portions 60 are provided on the bus bar 30-1. Also, the plurality of the fusing portions 60 are provided side by side in the Y axis direction corresponding to positional relations between the connection terminals 20 and the openings 32. In addition, each of the plurality of fusing portions 60 is provided off-centered from the center 120 of each connection terminals 20 in the same certain direction in the Y axis direction (in the present example, the +Y direction). Note that, the fusing portions 60 to be off-centered from the centers 120 of the connection terminals 20 in certain directions means, for example, the centers 66 of the fusing portions 60 are off-centered from the centers 120 of the connection terminals 20 in certain directions.

By providing the fusing portions 60 to be off-centered from the centers 120 to the same certain directions, resistance can be improved against torque having a direction parallel with the Z axis direction as a rotation axis. That is, even if torque of a kind to rotate the bus bar 30-1 in an X-Y plane is applied, physical connections become easy to be maintained between the connection terminals 20 and the openings 32 in the fusing portions 60.

Note that, in the present example, the number (the first number) of the fusing portions 60 to be provided corresponding to the connection terminals 20-A1, 20-A3, and 20-A5 is 3. Also, in the present example, the number (the second number) of the fusing portions 60 to be provided corresponding to the connection terminals 20-A2, 20-A4, and 20-A6 is also 3.

Figure 15:
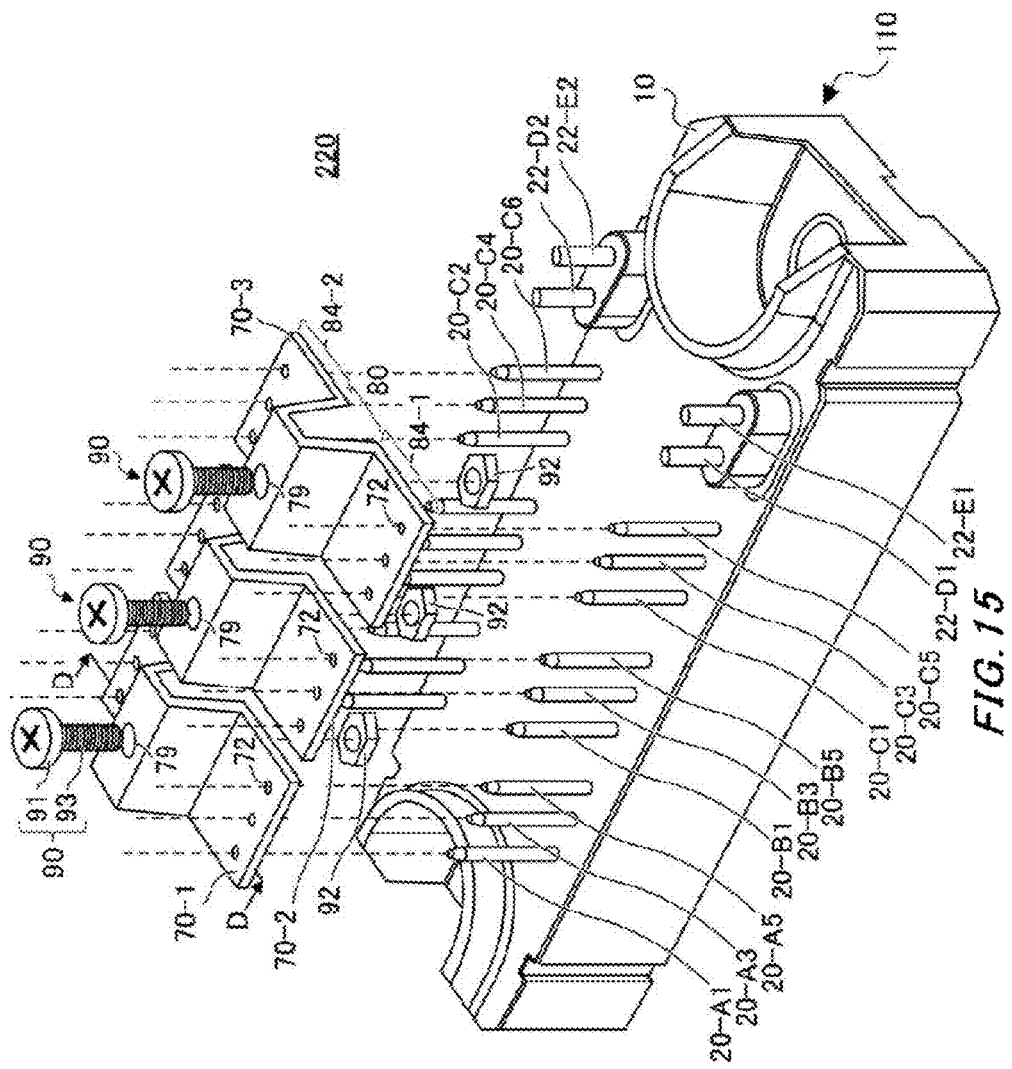
FIG. 15 is a perspective view illustrating a part of a power semiconductor device 220 in the third embodiment.

FIG. 15 is a perspective view illustrating a part of a power semiconductor device 220 in the third embodiment. The power semiconductor device 220 of the present example has a power semiconductor module 110 and bus bars 70. The power semiconductor module 110 has connection terminals 20. Six of which correspond to a drain terminal, a source terminal and an output terminal respectively, instead of 2 of which correspond to them respectively. Illustrated in FIG. 15 are connection terminals 20-A1 to 20-A6 which correspond to the drain terminal, connection terminals 20-B1 to 20-B6 which correspond to the source terminal, and connection terminals 20-C1 to 20-C6 which correspond to the output terminal. Note that, the number of connection terminals 20 is not limited to 6. It may be 4 or 8, or it may also be any even numbers. However, two connection terminals 22-D1 and 22-D2 which are source sensing terminals, and two connection terminals 22-E1 and 22-E2 which are gate terminals are provided, similar to those in the first embodiment.

The bus bar 70 is one plate including a convex 80 and flat parts 84. In the present example, the convex 80 means a portion other than the flat parts 84 that are parallel with the X-Y plane. The convex 80 of the present example is in a hat shape. The convex 80 may include a portion of the bus bar 70 which is protruding from the flat parts 84 in +Z direction. Convexes 80 have connection openings 79 through which fixing members 90 pass to fix bus bars 70 and external connection terminals. Fixing members 90 may be screws having head parts 91 that are provided with grooves or holes for turning, and stem parts 93 that are provided with grooves on their surfaces. Nuts 92 are members having female screws that are rotatably coupled to male screws of the stem parts 93. The fixing members 90 and the nuts 92 may have functions to sandwich and fix external connection terminals and the bus bars 70 between the head parts 91 and upper surfaces of the convexes 80. Diameters of the head parts 91 and the nuts 92 may be greater than diameters of connection openings 79 on the convexes 80.

The bus bars 70 in the present example have first flat parts 84-1 positioned on first sides of the convexes 80 in directions parallel with the X axis direction, and second flat parts 84-2 positioned on second sides to the convexes 80 in directions parallel with the X axis direction. The first flat parts 84-1 and the second flat parts 84-2 in the present example sandwich the convexes 80 in the X axis direction. There may be one opening 72 for one connection terminal 20 of each of the first flat parts 84-1 and each of the second flat parts 84-2. Note that, in order to facilitate understanding of shapes of the bus bars 70, the external connection terminals have been omitted from FIG. 15. The present example is different from the first embodiment mainly on this point described above, and all other components may be the same as the first embodiment. Thus, the same advantageous effect is obtained for the same technical feature as that of the first embodiment.

FIG. 16A is a top view of a bus bar 70-1 and the connection terminals 20-A1 to 20-A6 before welding. Illustrated in FIG. 16A is a state in which the connection terminals 20-A1 to 20-A6 have been made to pass through openings 72-A1 to 72-A6 respectively, and before welding each connection terminal 20 by laser light. If the bus bar 70 is seen from above, the bus bar 70 may be in a rectangular shape. The bus bar 70 in the present example has short sides 83 parallel with the Y axis direction and long sides 85 parallel with the X axis direction.

Figure 16B:
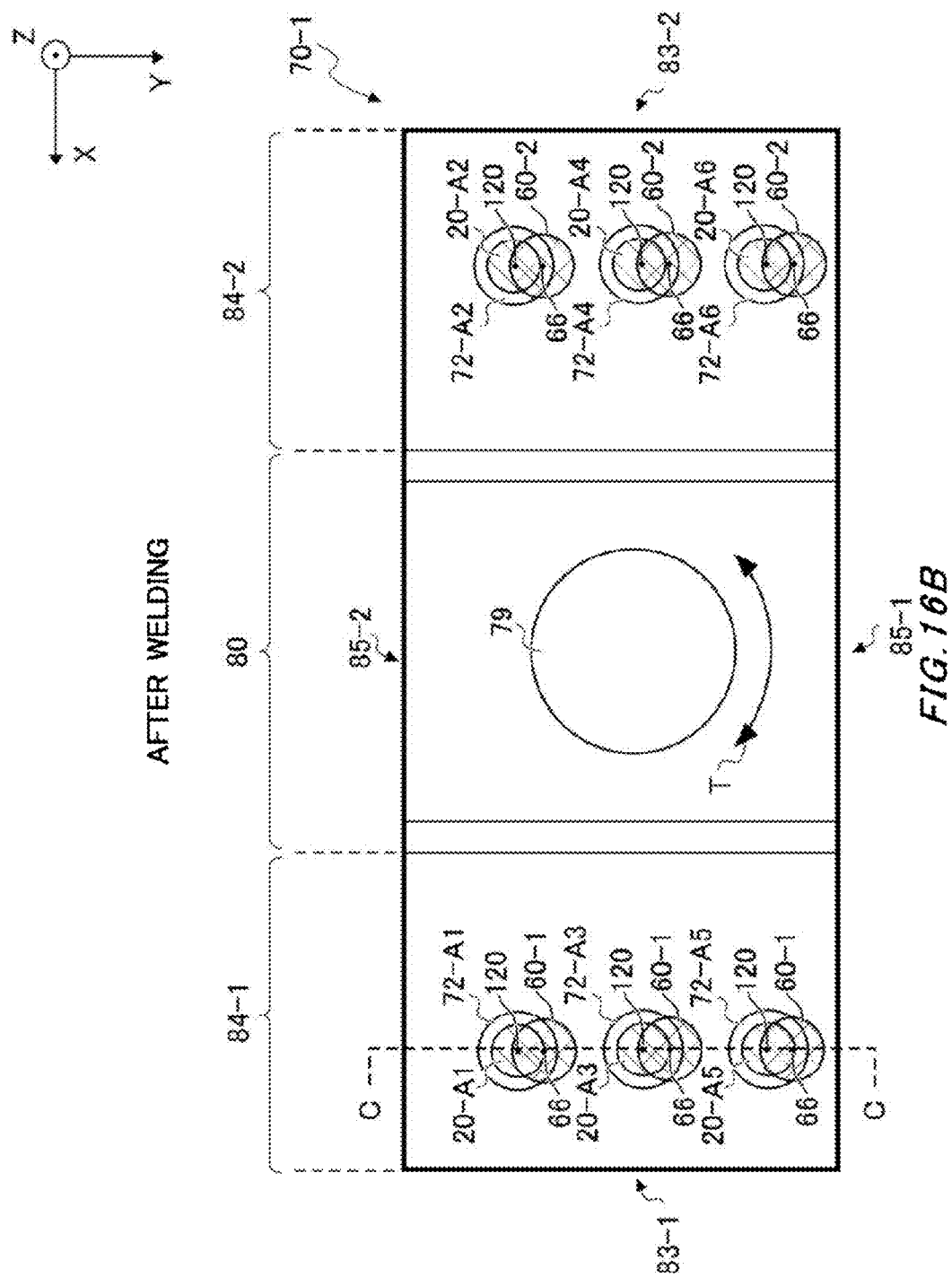
FIG. 16B is a top view of the bus bar 70-1 and connection terminals 20-A1 to 20-A6 after welding.

FIG. 16B is a top view of the bus bar 70-1 and connection terminals 20-A1 to 20-A6 after welding. A first flat part 84-1 may be provided with a first number of fusing portions 60-1 being side by side in the direction parallel with the Y axis direction. Note that, in FIG. 16B also, the connection terminals 20 are provided with hatching, and the fusing portions 60 are provided with cross-hatching. Also, a second flat part 84-2 may be provided with a second number of fusing portions 60-2 that are provided side by side in the direction parallel with the Y axis direction. In the present example, the first number and the second number are 3, respectively.

Each of the first number of fusing portions 60-1 and the second number of fusing portions 60-2 may be provided off-centered from the centers 120 of the connection terminals 20 to the same certain direction in the Y axis direction. In the present example, each of the fusing portions 60-1 and 60-2 is provided off-centered from the centers 120 of the connection terminals 20 in the +Y direction.

Instead of this, each of the fusing portions 60-1 and 60-2 may be provided off-centered from the centers 120 in the −Y direction. A connection opening 79 is a center of a rotation axis of torque T that is applied on bus bars 70 when the external connection terminal is installed on the bus bar 70 by the fixing member 90 and when it is removed. By providing all of the fusing portions 60-1 and 60-2 to be off-centered from the centers 120 either in the +Y direction or the −Y direction together, resistance can be improved against the torque T that is applied on the fusing portions 60, compared to a case in which each of the fusing portions 60-1 and 60-2 is off-centered randomly. That is, even if the torque T is applied on the bus bar 70 from the fixing member 90, physical connections are easily maintained between the connection terminals 20 and the openings 72 in the fusing portions 60.

Figure 17:
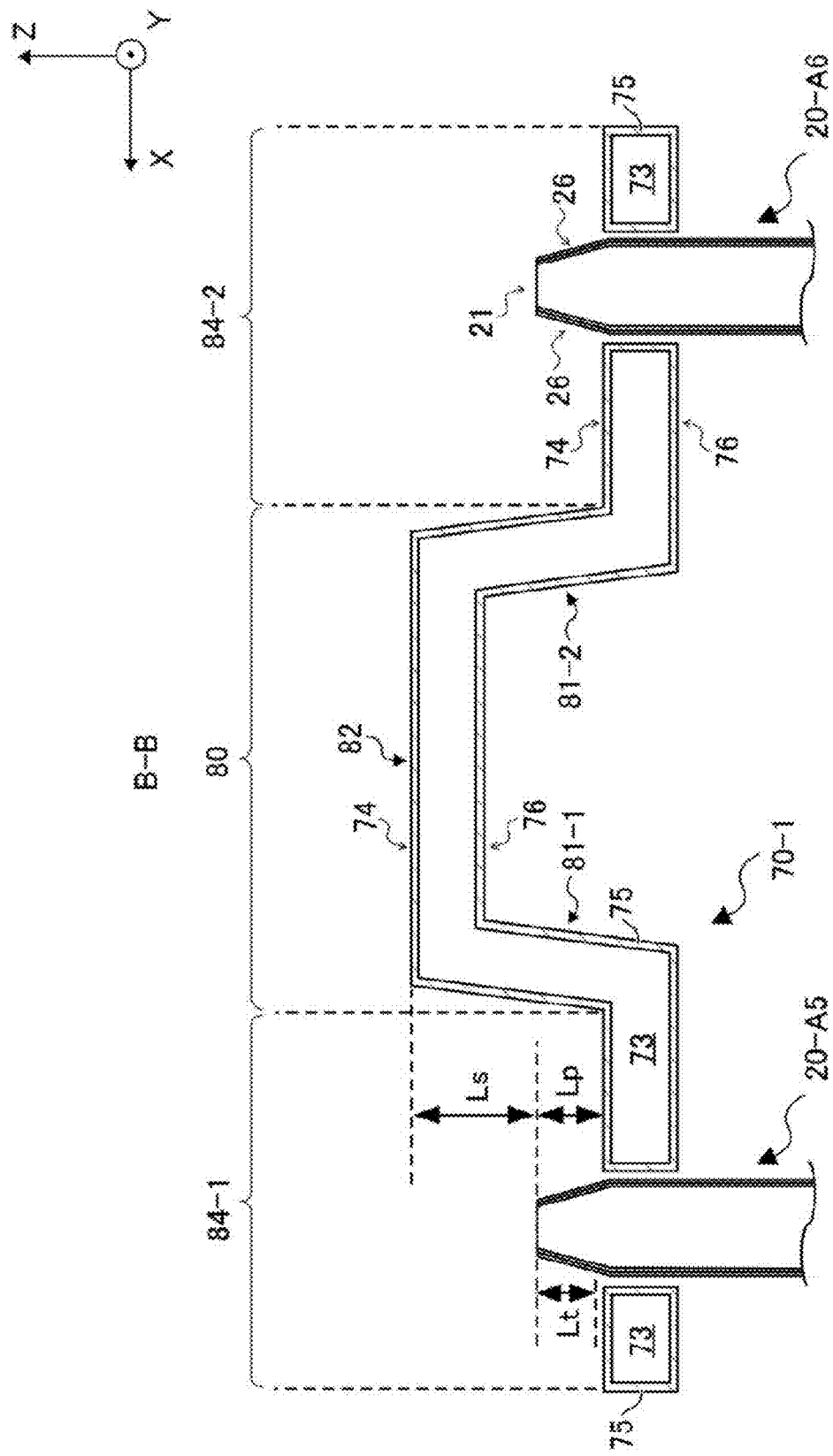
FIG. 17 is a drawing illustrating a cross section taken along B-B of FIG. 16A.

FIG. 17 is a drawing illustrating a cross section taken along B-B of FIG. 16A. The B-B cross section is a cross section parallel with an X-Z plane that passes through the connection terminals 20-A5 and 20-A6. As illustrated, the convex 80 has two sides 81, and a top part 82 sandwiched by the two sides. A side 81-1 in the present example has one side that is connected to the top part 82 and the other side that is connected to the first flat part 84-1. Similarly, a side 81-2 in the present example has one side that is connected to the top part 82 and the other side that is connected to a second flat part 84-2.

The bus bar 70 of the present example has body parts 73, and third plated layers 75 provided on surfaces of the body parts 73. Also, upper surfaces 74 are surfaces of the bus bar 70 in the +Z direction, and lower surfaces 76 are surfaces in the −Z direction. In the present example, the +Z direction surfaces and the −Z direction surfaces of the first flat part 84-1, the sides 81-1 and 81-2, the top part 82, and the second flat part 84-2 are referred to as the upper surfaces 74 and the lower surfaces 76, respectively. Also, in the present example, length from an upper end of the top part 82 of the convex 80 to an upper end of a top part 21 of the connection terminal 20 is Ls, length from the upper end of the top part 21 to a lower end of a taper part 26 is Lt, and length from the upper end of the top part 21 to the upper surface 74 of the bus bar 70 is Lp. Note that, the present example is designed such that Lt=0.3 mm, and Lp=0.5 mm.

Figure 18:
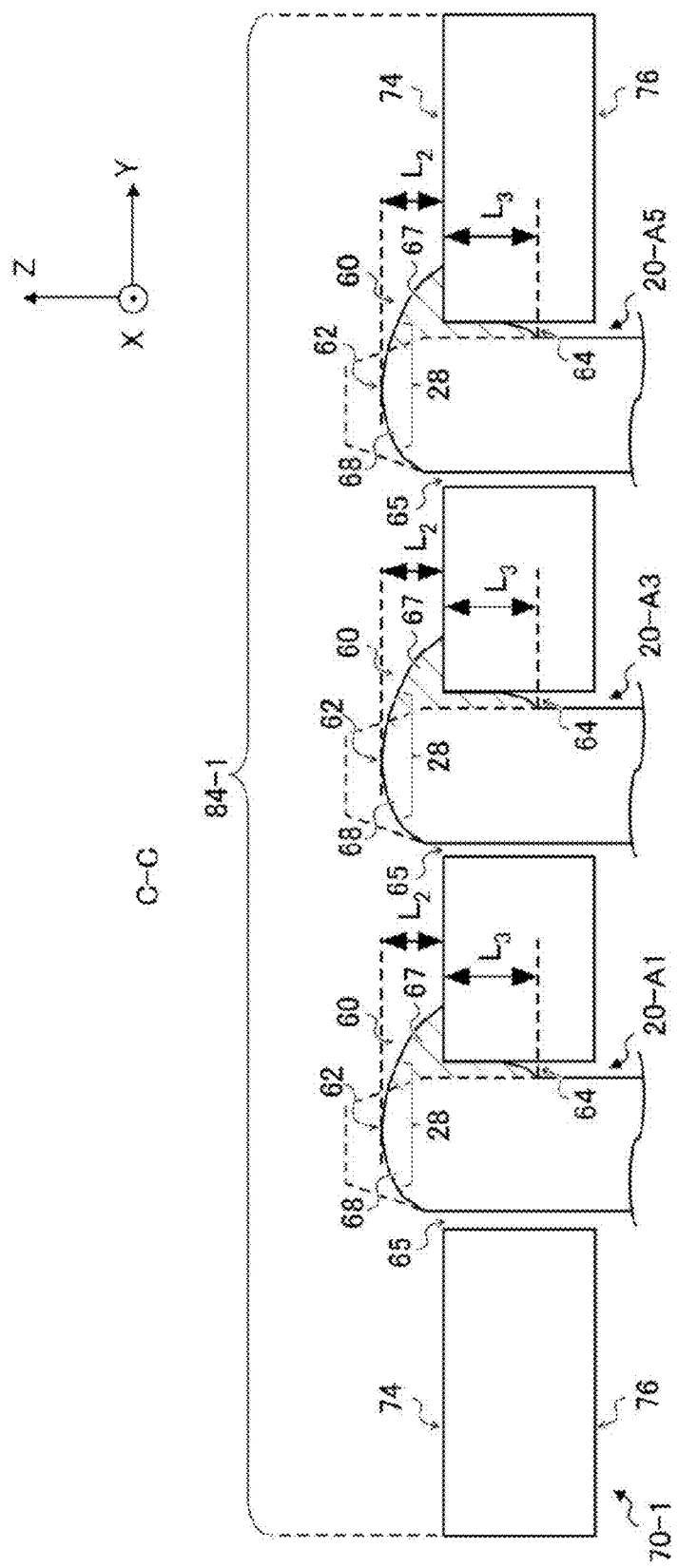
FIG. 18 is a drawing illustrating a cross section taken along C-C of FIG. 16B.

FIG. 18 is a drawing illustrating a cross section taken along C-C of FIG. 16B. FIG. 18 is a cross sectional view parallel with the Y-Z plane that passes through the connection terminals 20 and the bus bars 70 after welding. Length $L_2$ and $L_3$ may indicate the same parts as those described in FIG. 5 of the first embodiment.

Figure 19:
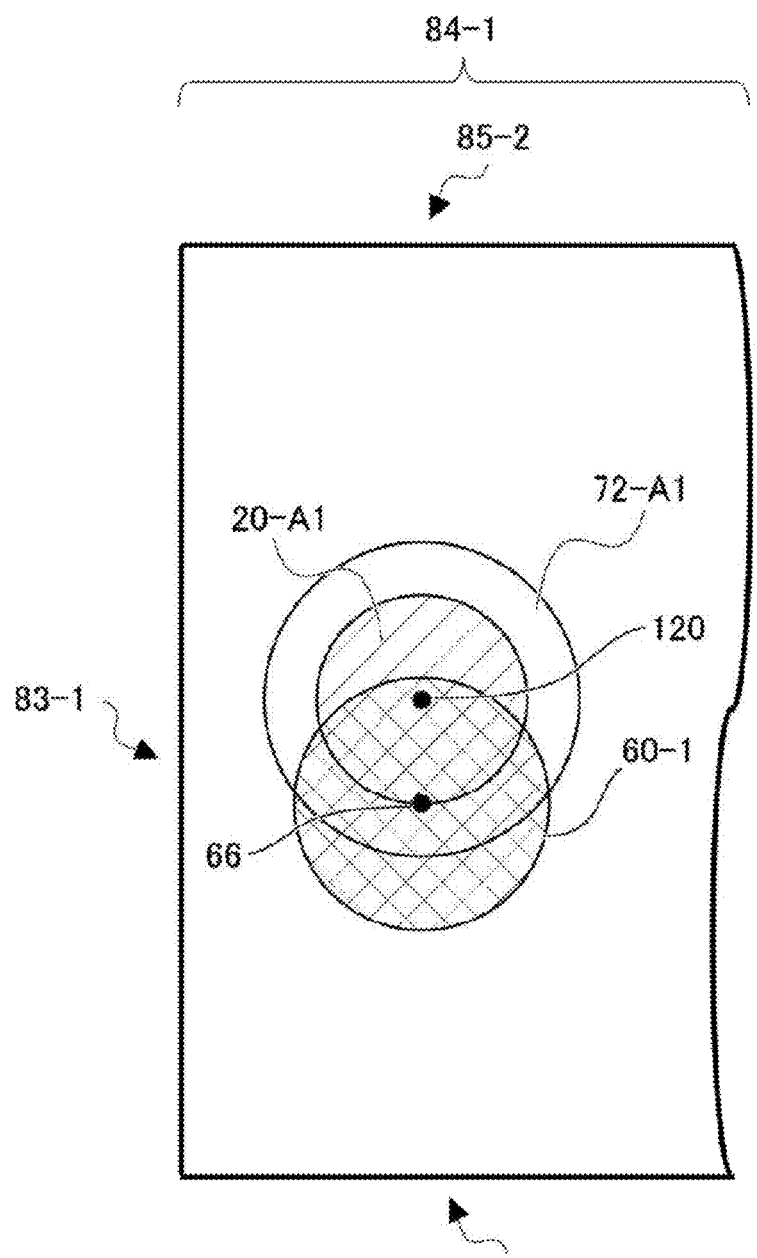
FIG. 19 is a top view illustrating a first modification example of a bus bar 70-1 and one connection terminal 20 after welding.

FIG. 19 is a top view illustrating a first modification example of the bus bar 70-1 and one connection terminal 20 after welding. FIG. 19 is also a drawing of the vicinity of a short side 83-1 of the flat part 84-1 in the bus bar 70-1 that is seen from above. In the present example, the first flat part 84-1 is provided with one opening 72-A1, and accordingly, it is provided with one connection terminal 20-A1 and one fusing portion 60-1. Similar to the example of FIG. 13, a fusing portion 60-1 provided on a bus bar 70-1 may be provided off-centered from a center 120 of a connection terminal 20-A1 in a certain direction. In the present example, the fusing portion 60-1 is off-centered from the center 120 in the +Y direction. In the present example also, the connection terminal 20 is provided with hatching, and the fusing portion 60 is provided with cross-hatching. Note that, configuration of connection terminals 20, openings 72, and fusing portions 60 in a flat part 84-2 may also be the same as that in a flat part 84-1.

Figure 20:
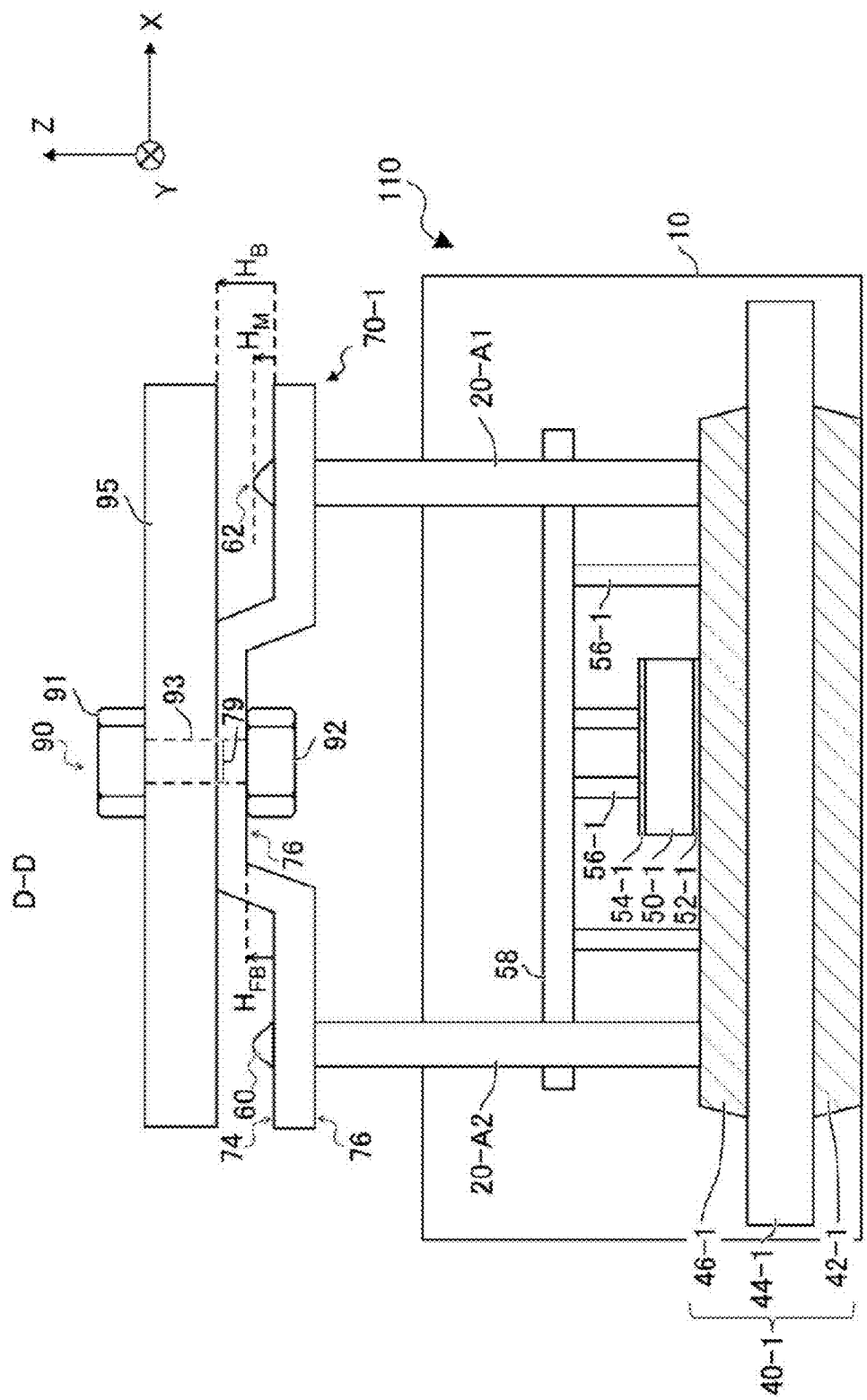
FIG. 20 is a drawing illustrating a cross section taken along D-D of FIG. 15 after welding.

FIG. 20 is a drawing illustrating a cross section taken along D-D of FIG. 15 after welding. FIG. 20 illustrates a state in which an external connection terminal 95 and the bus bar 70 are physically contacting each other by the fixing member 90 and a nut 92. The top part 82 of the convex 80 may be positioned above an upper end 62 of the connection terminal 20. That is, if the upper surface 74 of the flat part 84 of the bus bar 70 is used as reference, and when it is assumed that a height position of the upper end 62 of the fusing portion 60 is $H_M$, and a height position of the upper surface 74 of the convex 80 (i.e., a height position of the lower surface of the external connection terminal 95) is $H_B$, it may be $H_M<H_B$. Thereby, since the fusing portion 60 can be prevented from receiving damage, increase in contact resistance in the fusing portion 60 can be prevented.

$H_B-H_M$ is preferably 0.2 mm or longer, and more preferably, 0.5 mm or longer. Also, $H_M/H_B$ is preferably 0.71 or less, and more preferably, 0.50 or less. If $H_B-H_M$ and $H_M/H_B$ is within the above-mentioned range, even if the bus bar 70 is pushed in the Z axis direction and distorted when installing the external connection terminal 95, the fusing portion 60 can be prevented from receiving damage.

A lower surface 76 of the top part 82 in the convex 80 may be positioned above the upper surfaces 74 of the flat parts 84 in the bus bar 70 other than that of the convex 80 (this situation is illustrated with $H_{FB}$). The top part 82 of the convex 80 of the present example is not in a so-called thick shape, where the lower surface 76 of the top part 82 is positioned below the upper surfaces 74 of the flat parts 84. Thereby, in a screw-tightening process, the top part 82 is easy to be deformed corresponding to the torque T that is applied on the bus bar 70 from the fixing member 90, compared to a case in which the top part 82 is in a so-called thick shape. Thus, it is advantageous that, contact area of the external connection terminal 95 and the bus bar 70 is easily secured. Note that, in the present example, the thickness of the top part 82 in the Z axis direction is the same as the thickness of the flat parts 84 in the Z axis direction, and the lower surface 76 of the top part 82 is positioned above the upper surfaces 74 of the flat parts 84. However, the thickness of the top part 82 in the Z axis direction may be thicker than the thickness of the flat parts 84 in the Z axis direction, or it may also be thinner than that. It is advantageous that, if the top part 82 and sides 81 of the convex 80, and the flat parts 84 have the same thickness, the bus bar 70 can be formed by deforming one plate.

Figure 21:
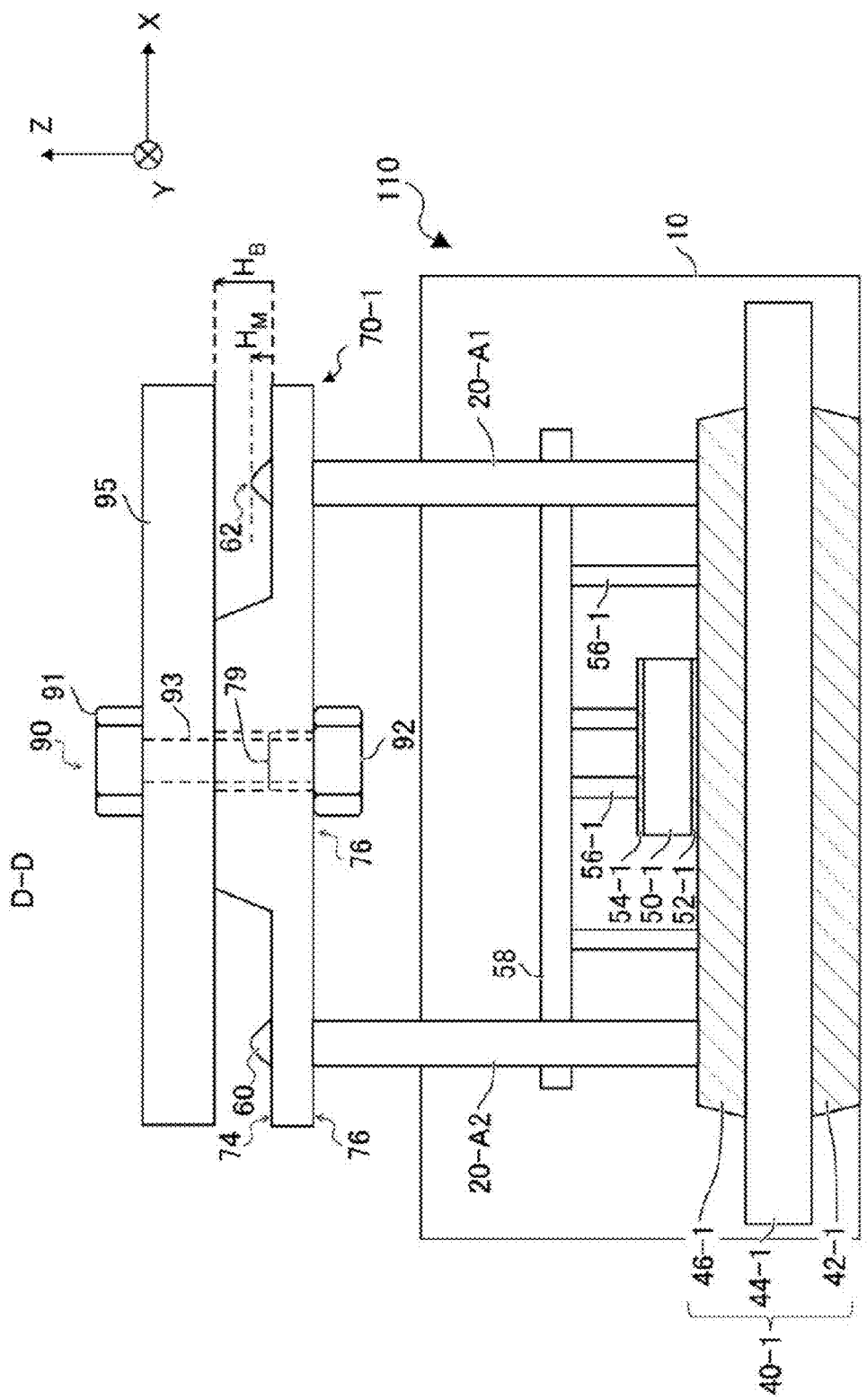
FIG. 21 is a drawing illustrating a cross section taken along D-D of FIG. 15 in a first modification example after welding.

FIG. 21 is a drawing illustrating a cross section taken along D-D of FIG. 15 after welding, in a first modification example. The present example is an example in which height positions of the lower surface 76 of the convex 80 and the lower surfaces 76 of the flat parts 84 are coincident with each other, in the third embodiment. There is the connection opening 79 on the bus bar 70 of the present example, which is open from the upper surface 74 all the way through to the lower surface 76 of the convex 80, and which accommodates the stem part 93 of the fixing member 90. A diameter of the connection opening 79 of the present example may be larger than a diameter of the stem part 93 (that is, it may be a clearance hole), or it may be the same as the diameter of the stem part 93. In the present example also, by making $H_M<H_B$, increase in contact resistance can be prevented in the fusing portions 60.

Figure 22:
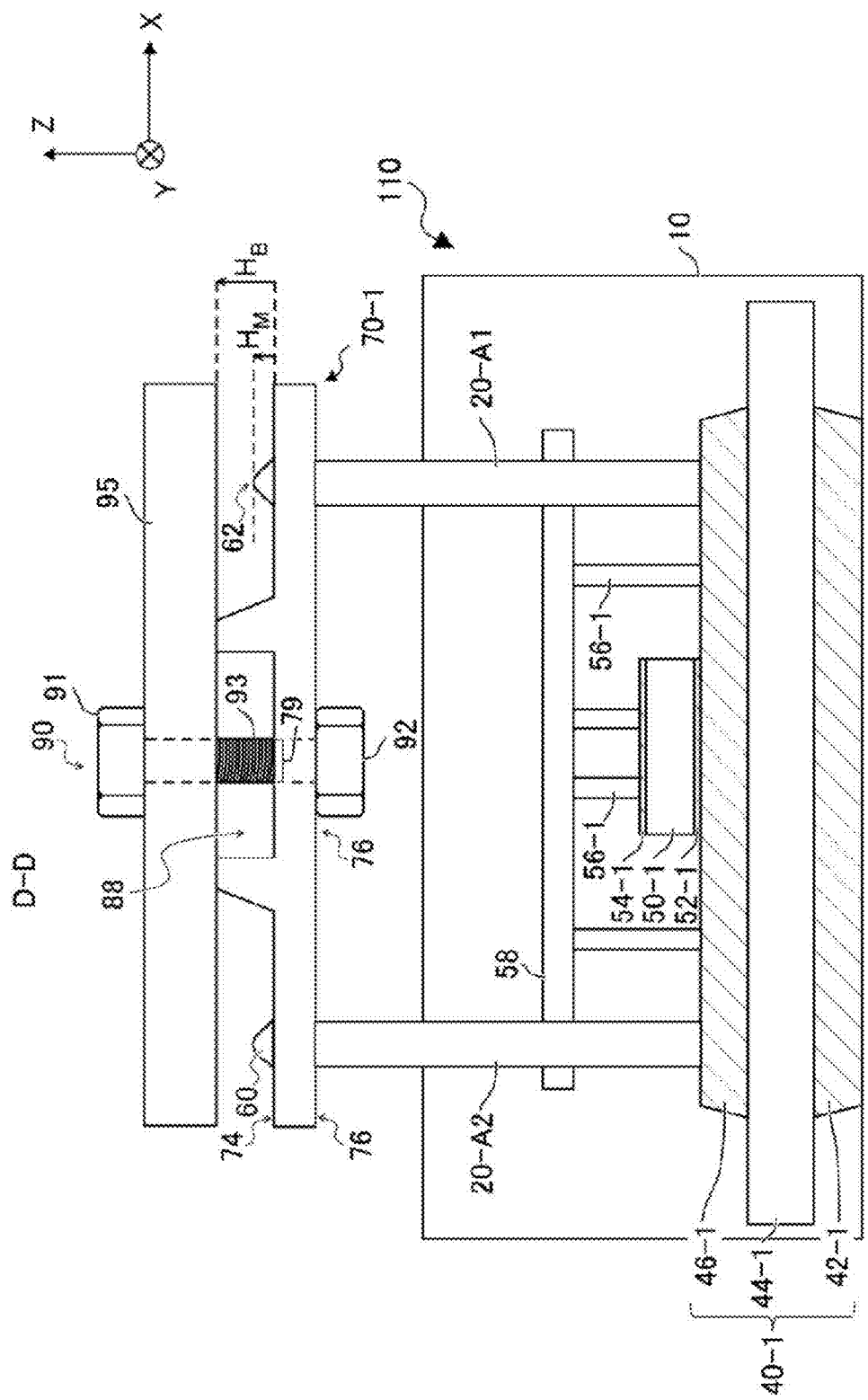
FIG. 22 is a drawing illustrating a cross section taken along D-D of FIG. 15 in a second modification example after welding.

FIG. 22 is a drawing illustrating a cross section taken along D-D of FIG. 15 after welding, in a second modification example. The present example is an example in which height positions of the lower surface 76 of the convex 80 and the lower surfaces 76 of the flat parts 84 are coincident with each other, in the third embodiment. However, the bus bar 70 of the present example has a concave 88 in a height range between the upper surface 74 and the lower surface 76 of the convex 80, which is larger than the diameter of the stem part 93 of the fixing member 90. In the present example, a height position of an upper surface 74 of the concave 88 is coincident with a height position of an upper surface 74 of the flat part 84. In the present example also, by making $H_M<H_B$, increase in contact resistance can be prevented in the fusing portions 60. Note that, there is the connection opening 79 on the bus bar 70 of the present example, which is open from the upper surface 74 corresponding to the bottom of the concave 88 all the way through to the lower surface 76, and which accommodates the stem part 93 of the fixing member 90.

Figure 23:
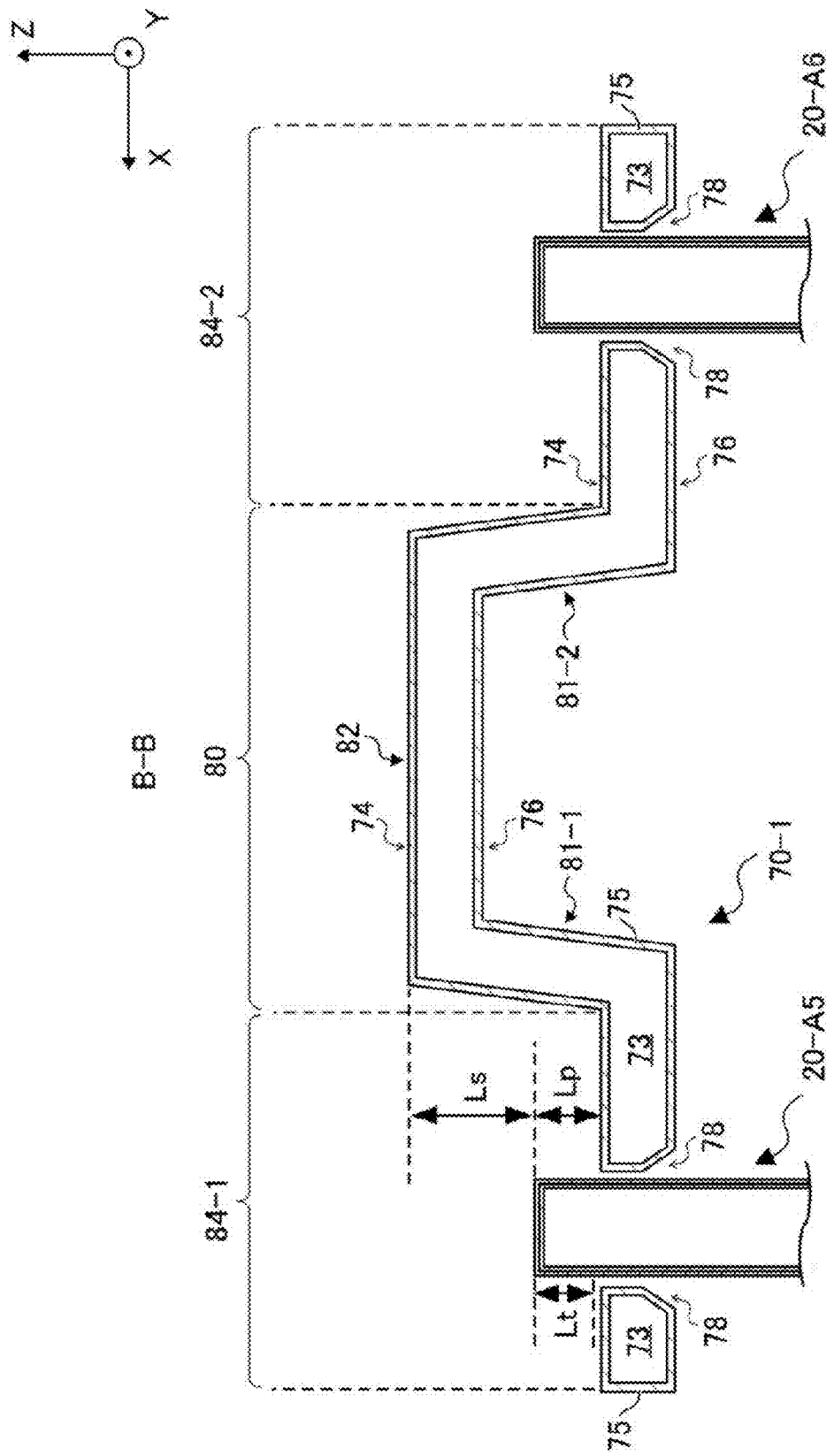
FIG. 23 is a drawing illustrating a cross section taken along B-B of FIG. 16A in the fourth embodiment.

FIG. 23 is a drawing illustrating a cross section taken along B-B of FIG. 16A in the fourth embodiment. In the present example, there are taper parts 78 in the openings 72 of the bus bar 70 at edges of the lower surfaces 76. Since it is facilitated to insert connection terminals 20 to the openings 72 of the bus bar 70 by providing the taper parts 78, assembly of the power semiconductor device becomes easy compared to a case in which taper parts 78 are not provided.

The taper parts 78 may make diameters of the openings 72 to become small from the lower surfaces 76 toward the upper surfaces 74. In parts of the openings 72 of the present example, the taper parts 78 are provided from the lower surfaces 76 to reach predetermined height positions in the +Z direction, and the rest of the portions are provided with cylindrical portions that are the same as those in the third embodiment. More specifically, the lower half and the upper half in the Z axis direction are the taper parts 78 and the cylindrical portions respectively. Note that, the present embodiment having the bus bar 70 that is provided with the taper parts 78 may be combined with the third embodiment.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a connection terminal electrically connected to a semiconductor chip;
   a bus bar with an opening through which the connection terminal passes; and
   a fusing portion including a jointing portion which is provided over an upper surface of the bus bar from an upper part of the connection terminal that is positioned above the upper surface of the bus bar, as the connection terminal passes through the opening of the bus bar, wherein
   the jointing portion is a part of the connection terminal that is welded to the bus bar, in a clearance between a side surface of the connection terminal and a side surface of an opening of the bus bar, and
   the fusing portion has a non-jointing portion which is a part of the connection terminal that is not welded to the bus bar, and which is positioned opposite to the jointing portion in a direction orthogonal to a length direction of the connection terminal.

2. A semiconductor device comprising:
   a connection terminal electrically connected to a semiconductor chip;
   a bus bar with an opening through which the connection terminal passes; and
   a fusing portion including a jointing portion which is provided over an upper surface of the bus bar from an upper part of the connection terminal that is positioned above the upper surface of the bus bar, as the connection terminal passes through the opening of the bus bar, wherein length from an upper end of the fusing portion to the upper surface of the bus bar is 0.1 mm or longer.

3. A semiconductor device comprising:
   a connection terminal electrically connected to a semiconductor chip;
   a bus bar with an opening through which the connection terminal passes; and
   a fusing portion including a jointing portion which is provided over an upper surface of the bus bar from an upper part of the connection terminal that is positioned above the upper surface of the bus bar, as the connection terminal passes through the opening of the bus bar, wherein length from an upper end of the fusing portion to the upper surface of the bus bar is 0.9 mm or shorter.

4. The semiconductor device according to claim 1, wherein if the connection terminal and the bus bar are seen from above:
   an outline of the connection terminal is partially in a circular shape; and
   a sectorial shaped central angle defined by a center and a radius of a circular shape of the connection terminal is between 86 degrees and 287 degrees inclusive, in a region where the fusing portion and the connection terminal overlap each other.

5. The semiconductor device according to claim 1, wherein if the connection terminal and the bus bar are seen from above:
   a ratio of a diameter of the connection terminal to a diameter of an opening of the bus bar is between 0.907 and 0.991 inclusive.

6. The semiconductor device according to claim 1, wherein the connection terminal includes:
   a first body part containing copper material;
   a first plated layer which is provided on a surface of the first body part, and which contains nickel material; and
   a second plated layer which is provided on a surface of the first plated layer, and which contains tin material.

7. The semiconductor device according to claim 1, wherein the connection terminal includes a tapered part that is provided from an upper part of the connection terminal to a predetermined height position in a length direction of the connection terminal.

8. The semiconductor device according to claim 1, wherein the bus bar has a tapered part in its opening, which reduces a diameter of the opening from a lower surface toward the upper surface, at an edge of the lower surface that is opposite to the upper surface.

9. The semiconductor device according to claim 1, wherein if the bus bar is seen from above, the semiconductor device has the fusing portion on the bus bar, which is provided off-centered from a center of the connection terminal in a certain direction.

10. The semiconductor device according to claim 1, wherein:
    the bus bar includes a convex portion with a connection opening through which a fixing member to fix the bus bar and an external connection terminal passes; and
    a top part of the convex portion is positioned above an upper end of the connection terminal.

11. The semiconductor device according to claim 2, wherein the connection terminal includes:
    a first body part containing copper material;
    a first plated layer which is provided on a surface of the first body part, and which contains nickel material; and
    a second plated layer which is provided on a surface of the first plated layer, and which contains tin material.

12. The semiconductor device according to claim 3, wherein the connection terminal includes:
    a first body part containing copper material;
    a first plated layer which is provided on a surface of the first body part, and which contains nickel material; and
    a second plated layer which is provided on a surface of the first plated layer, and which contains tin material.

13. The semiconductor device according to claim 2, wherein the connection terminal includes a tapered part that is provided from an upper part of the connection terminal to a predetermined height position in a length direction of the connection terminal.

14. The semiconductor device according to claim 3, wherein the connection terminal includes a tapered part that is provided from an upper part of the connection terminal to a predetermined height position in a length direction of the connection terminal.

15. The semiconductor device according to claim 2, wherein the bus bar has a tapered part in its opening, which reduces a diameter of the opening from a lower surface toward the upper surface, at an edge of the lower surface that is opposite to the upper surface.

16. The semiconductor device according to claim 3, wherein the bus bar has a tapered part in its opening, which reduces a diameter of the opening from a lower surface toward the upper surface, at an edge of the lower surface that is opposite to the upper surface.

17. The semiconductor device according to claim 2, wherein if the bus bar is seen from above, the semiconductor device has the fusing portion on the bus bar, which is provided off-centered from a center of the connection terminal in a certain direction.

18. The semiconductor device according to claim 3, wherein if the bus bar is seen from above, the semiconductor device has the fusing portion on the bus bar, which is provided off-centered from a center of the connection terminal in a certain direction.

19. The semiconductor device according to claim 2, wherein:
   the bus bar includes a convex portion with a connection opening through which a fixing member to fix the bus bar and an external connection terminal passes; and
   a top part of the convex portion is positioned above an upper end of the connection terminal.

20. The semiconductor device according to claim 3, wherein:
   the bus bar includes a convex portion with a connection opening through which a fixing member to fix the bus bar and an external connection terminal passes; and
   a top part of the convex portion is positioned above an upper end of the connection terminal.

* * * * *